(12) United States Patent
Chen

(10) Patent No.: US 12,615,840 B2
(45) Date of Patent: Apr. 28, 2026

(54) SEMICONDUCTOR DEVICE WITH ANNULAR SEMICONDUCTOR FIN AND METHOD FOR PREPARING THE SAME

(71) Applicant: NANYA TECHNOLOGY CORPORATION, New Taipei City (TW)

(72) Inventor: Te-Yin Chen, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 420 days.

(21) Appl. No.: 18/514,106

(22) Filed: Nov. 20, 2023

(65) Prior Publication Data

US 2025/0107224 A1     Mar. 27, 2025

Related U.S. Application Data

(62) Division of application No. 18/372,241, filed on Sep. 25, 2023, now Pat. No. 12,538,568.

(51) Int. Cl.
| | |
|---|---|
| *H10D 84/85* | (2025.01) |
| *H10D 30/01* | (2025.01) |
| *H10D 30/63* | (2025.01) |
| *H10D 62/17* | (2025.01) |
| *H10D 64/01* | (2025.01) |
| *H10D 64/23* | (2025.01) |
| *H10D 84/01* | (2025.01) |
| *H10D 84/03* | (2025.01) |
| *H10P 50/00* | (2026.01) |
| *H10P 50/24* | (2026.01) |

(52) U.S. Cl.
CPC ........... *H10D 84/85* (2025.01); *H10D 30/025* (2025.01); *H10D 30/63* (2025.01); *H10D 62/292* (2025.01); *H10D 64/0112* (2026.01); *H10D 64/018* (2025.01); *H10D 64/252* (2025.01); *H10D 84/0167* (2025.01); *H10D 84/017* (2025.01); *H10D 84/0195* (2025.01); *H10D 84/038* (2025.01); *H10P 50/242* (2026.01); *H10P 50/691* (2026.01)

(58) Field of Classification Search
None
See application file for complete search history.

(56) References Cited

U.S. PATENT DOCUMENTS 11,296,211 B2 *    4/2022    Chen ................... H10D 30/025

* cited by examiner

*Primary Examiner* — Jack S Chen
(74) *Attorney, Agent, or Firm* — Xuan Zhang

(57)     ABSTRACT

An electronic device and a manufacturing method are provided. The electronic device includes a first semiconductor chip, a second semiconductor chip and a third semiconductor chip. The second semiconductor chip is stacked on the first semiconductor chip, and is electrically connected to the first semiconductor chip by hybrid bonding. The third semiconductor chip is stacked on the second semiconductor chip, and is electrically connected to the second semiconductor chip through a plurality of bumps.

12 Claims, 30 Drawing Sheets

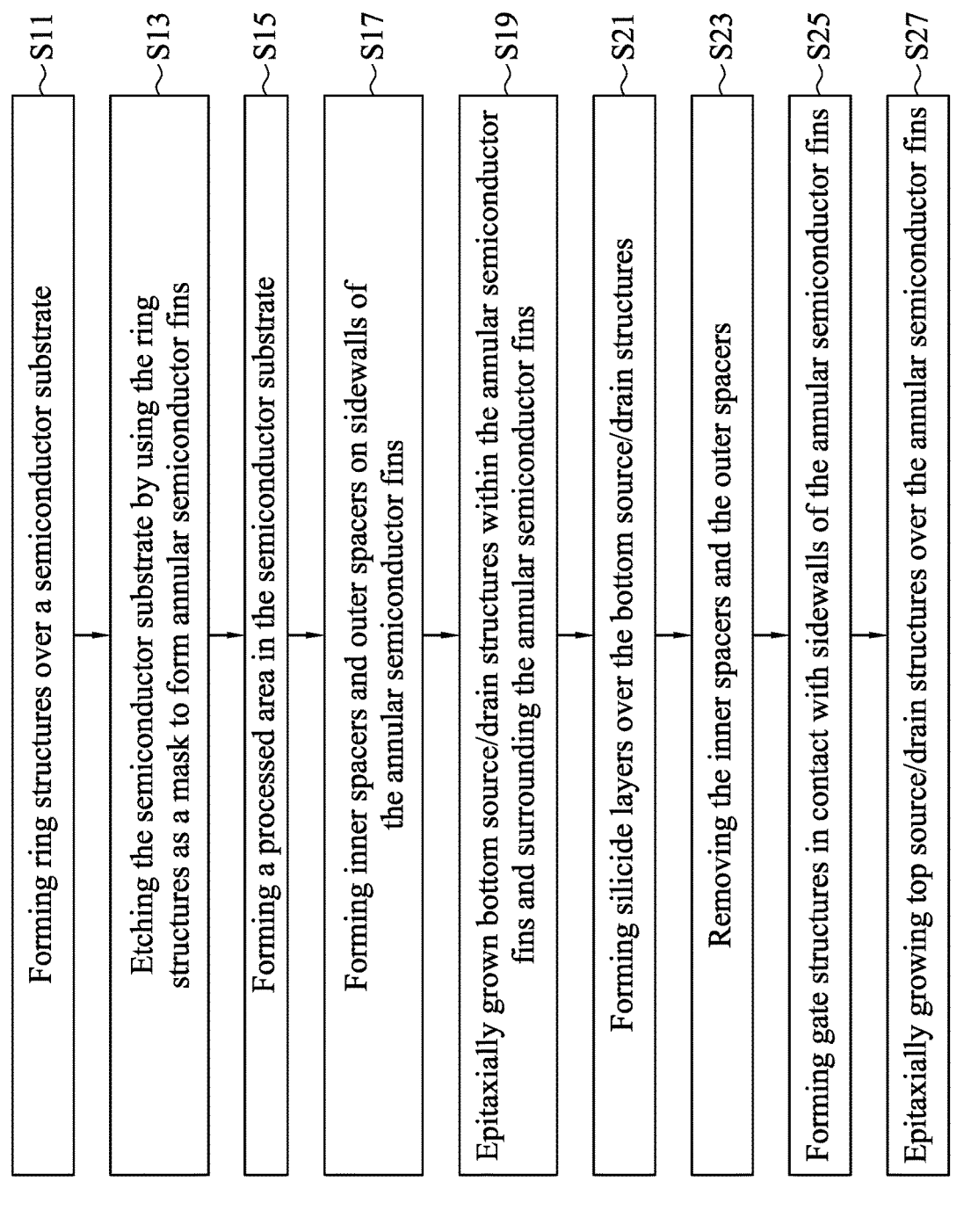

Forming ring structures over a semiconductor substrate ~S11

Etching the semiconductor substrate by using the ring structures as a mask to form annular semiconductor fins ~S13

Forming a processed area in the semiconductor substrate ~S15

Forming inner spacers and outer spacers on sidewalls of the annular semiconductor fins ~S17

Epitaxially grown bottom source/drain structures within the annular semiconductor fins and surrounding the annular semiconductor fins ~S19

Forming silicide layers over the bottom source/drain structures ~S21

Removing the inner spacers and the outer spacers ~S23

Forming gate structures in contact with sidewalls of the annular semiconductor fins ~S25

Epitaxially growing top source/drain structures over the annular semiconductor fins ~S27

SEMICONDUCTOR DEVICE WITH ANNULAR SEMICONDUCTOR FIN AND METHOD FOR PREPARING THE SAME

CROSS-REFERENCE TO RELATED APPLICATION

This application is a divisional application of U.S. Non-Provisional application Ser. No. 18/372,241 filed Sep. 25, 2023, which is incorporated herein by reference in its entirety.

TECHNICAL FIELD

The present disclosure relates to a semiconductor device and a method for preparing the same, and more particularly, to a semiconductor device and a method for preparing the same with an annular semiconductor fin.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device includes an annular semiconductor fin over a semiconductor substrate, a first bottom source/drain structure within the annular semiconductor fin, a second bottom source/drain structure surrounding the annular semiconductor fin, a first silicide layer, a second silicide layer, a first gate structure, a second gate structure, a top source/drain structure, and a contact structure over the top source/drain structure. The first silicide layer and the second silicide layer are over the first bottom source/drain structure and the second bottom source/drain structure, respectively. The first gate structure and the second gate structure are over the first silicide layer and the second silicide layer, respectively. The contact structure includes a lower contact, a middle contact over the lower contact, and an upper contact over the middle contact. A width of the upper contact is greater than a width of the middle contact.

In another embodiment of the present disclosure, a method is provided for preparing a semiconductor device. The method includes: forming a ring structure over a semiconductor substrate; etching the semiconductor substrate by using the ring structure as a mask to form an annular semiconductor fin; epitaxially growing a first bottom source/drain structure within the annular semiconductor fin and a second bottom source/drain structure surrounding the annular semiconductor fin; forming a first silicide layer over the first bottom source/drain structure and a second silicide layer over the second bottom source/drain structure; forming a first gate structure over the first silicide layer and a second gate structure over the second silicide layer; epitaxially growing a top source/drain structure over the annular semiconductor fin; and forming a contact structure over the top source/drain structure. The step of forming the contact structure over the top source/drain structure includes: forming a lower contact of the contact structure over the top source/drain structure; forming a middle contact of the contact structure over the lower contact; and forming an upper contact over the middle contact. A width of the upper contact is greater than a width of the middle contact.

Embodiments of a method for preparing a semiconductor device are provided in the disclosure. The method includes etching a semiconductor substrate by using a ring structure as a mask to form an annular semiconductor fin, and forming a transistor (e.g., a vertical field effect transistor (FET)) by using the annular semiconductor fin as a vertical channel. As a result, the integration density of the semiconductor device may be significantly increased. Moreover, the method also includes forming a first gate structure within the annular semiconductor fin and a second gate structure surrounding the annular semiconductor fin. Therefore, the control of the current in the annular semiconductor fin may be improved, thus upgrading the device performance.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1 is a flow diagram illustrating a method for preparing a semiconductor device, in accordance with some embodiments.

FIG. 23 is a cross-sectional view illustrating an intermediate stage of forming top source/drain structures during the formation of the semiconductor device, in accordance with some embodiments.

FIG. 30 is a cross-sectional view illustrating an intermediate stage of forming liners during the formation of the semiconductor device, in accordance with various embodiments.

DETAILED DESCRIPTION

Figure 2:
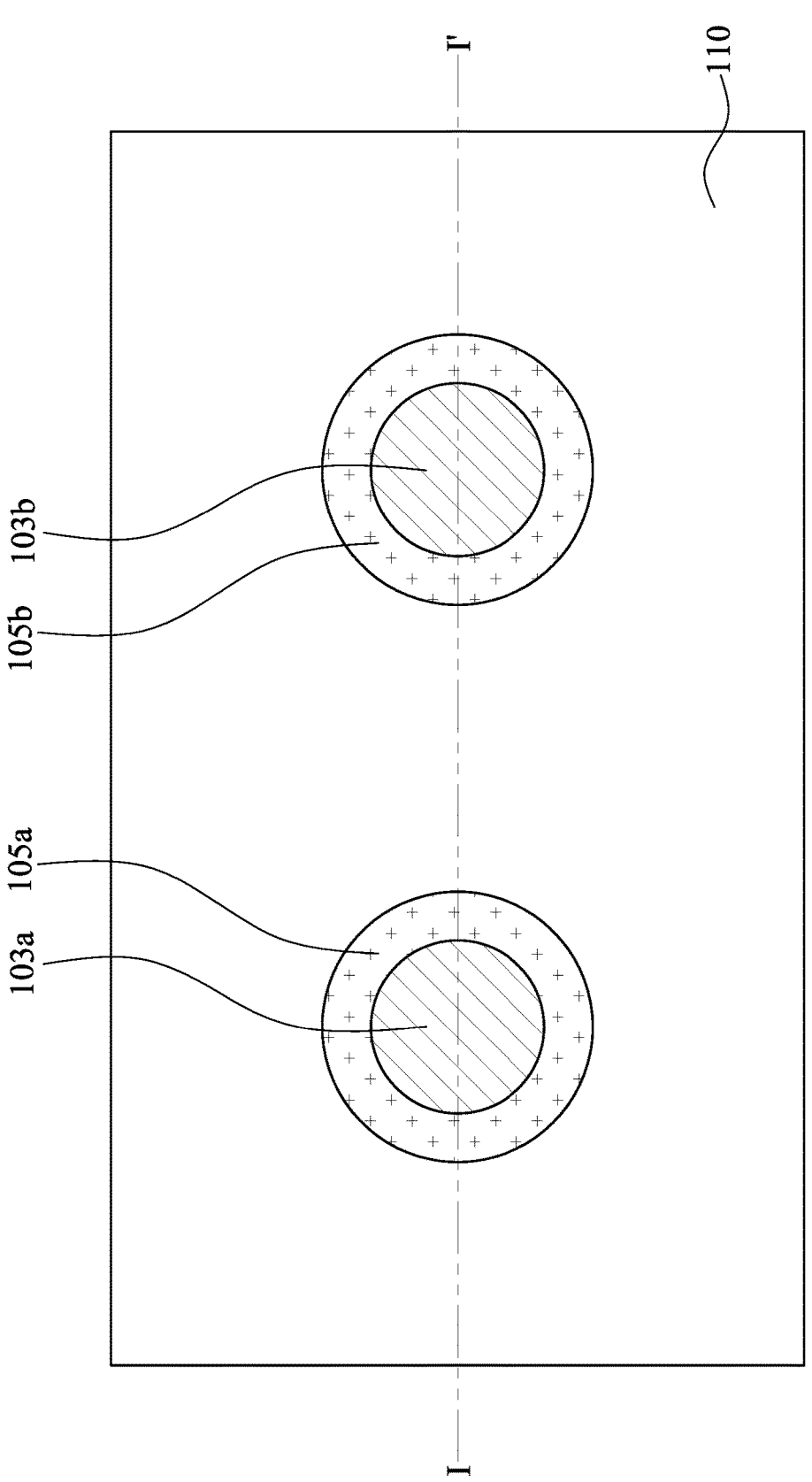
FIG. 2 is a top view illustrating an intermediate stage of forming cylindrical structures and ring structures over a semiconductor substrate during the formation of the semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow diagram illustrating a method 10 for preparing a semiconductor device 100, and the method 10 includes steps S11, S13, S15, S17, S19, S21, S23, S25, and S27, in accordance with some embodiments. The steps S11 to S27 of FIG. 1 are first introduced briefly and then elaborated in connection with the following figures.

As shown in FIG. 1, the method 10 begins at step S11 where ring structures are formed over a semiconductor substrate, and at step S13, the semiconductor substrate is etched by using the ring structures as a mask, such that annular semiconductor fins are formed. In some embodiments, a top surface of the semiconductor substrate is exposed by the annular semiconductor fins. Then, at step S15, a processed area is formed in the semiconductor substrate. In some embodiments, in order to form the processed area, dopants are implanted into the top surface of the semiconductor substrate exposed by the annular semiconductor fins.

At step S17, inner spacers and outer spacers are formed on sidewalls of the annular semiconductor fins. In some embodiments, the inner spacers are formed on inner sidewalls of the annular semiconductor fins, and the outer spacers are formed on outer sidewalls of the annular semiconductor fins. At step S19, bottom source/drain structures are epitaxially grown within the annular semiconductor fins and surrounding the annular semiconductor fins. In some embodiments, the semiconductor substrate (including the processed area) is further etched to form recesses within the annular semiconductor fins and surrounding the annular semiconductor fins, and the bottom source/drain structures are epitaxially grown in the recesses.

Still referring to FIG. 1, at step S21, silicide layers are formed over the bottom source/drain structures. In some embodiments, the bottom source/drain structures surrounding the annular semiconductor fins are covered and surrounded by the silicide layers. At step S23, the inner spacers and the outer spacers are removed. In some embodiments, the inner sidewalls and the outer sidewalls of the annular semiconductor fins are exposed. Next, at step S25, gate structures are formed in contact with sidewalls of the annular semiconductor fins. In some embodiments, the inner sidewalls and the outer sidewalls of the annular semiconductor fins are in direct contact with the gate structures.

At step S27, top source/drain structures are epitaxially grown over the annular semiconductor fins. In some embodiments, ring structures over the annular semiconductor fins are removed before the top source/drain structures are grown, and top surfaces of the annular semiconductor fins are in direct contact with the top source/drain structures. After the top source/drain structures are grown, the semiconductor device 100 is obtained. In some embodiments, the semiconductor device 100 includes vertical field effect transistors, and each of the annular semiconductor fins is a vertical channel with source/drain structures at ends of the channel on top and bottom sides of the fin. Specifically, the current flows through the annular semiconductor fin along a vertical direction. For example, from a bottom source/drain structure to a top source/drain structure.

Figure 3:
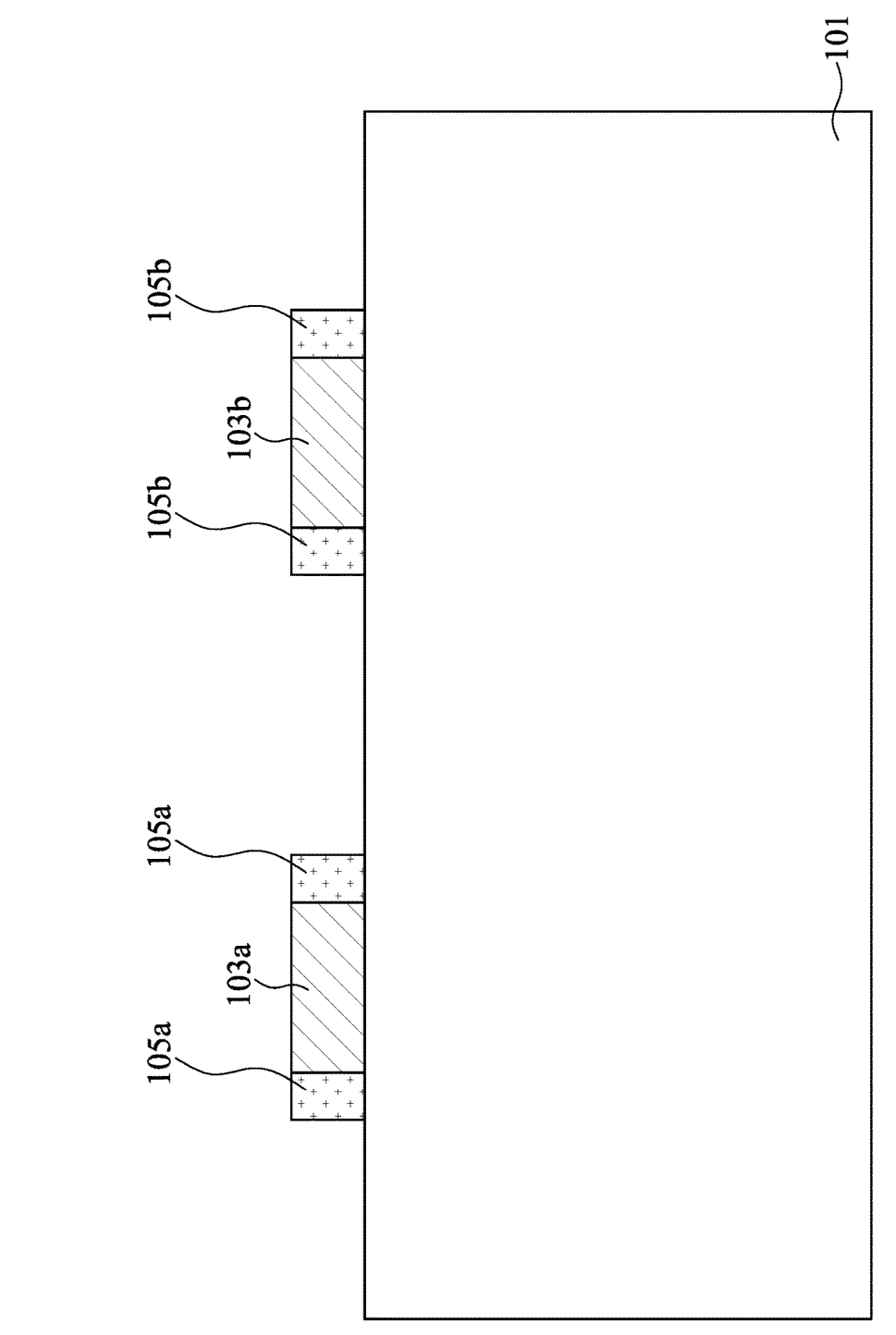
FIG. 3 is a cross-sectional view illustrating an intermediate stage of forming cylindrical structures and ring structures over a semiconductor substrate during the formation of the semiconductor device along the sectional line I-I' in FIG. 2, in accordance with some embodiments.
Figure 4:
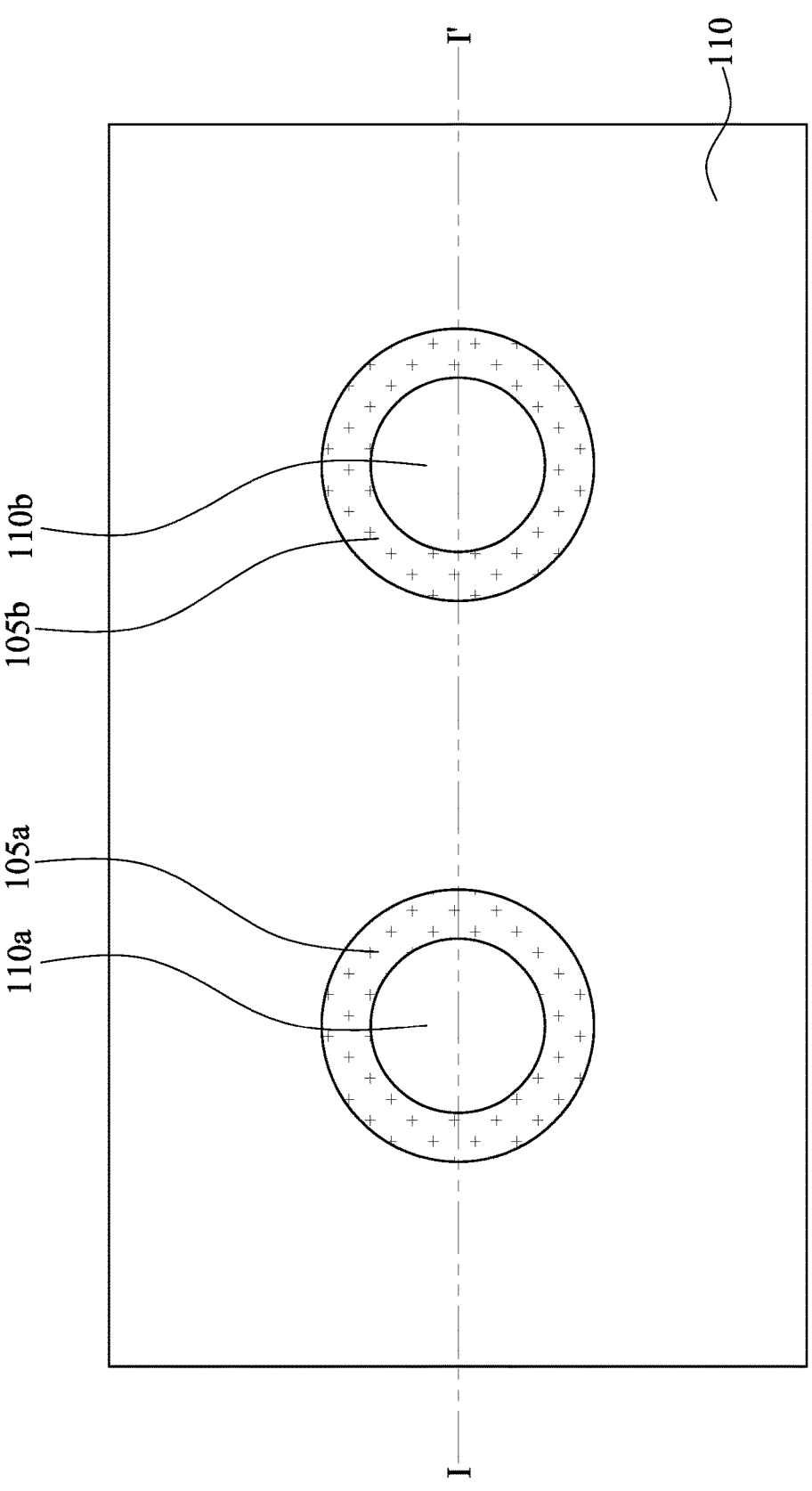
FIG. 4 is a top view illustrating an intermediate stage of removing the cylindrical structures during the formation of the semiconductor device, in accordance with some embodiments.
Figure 5:
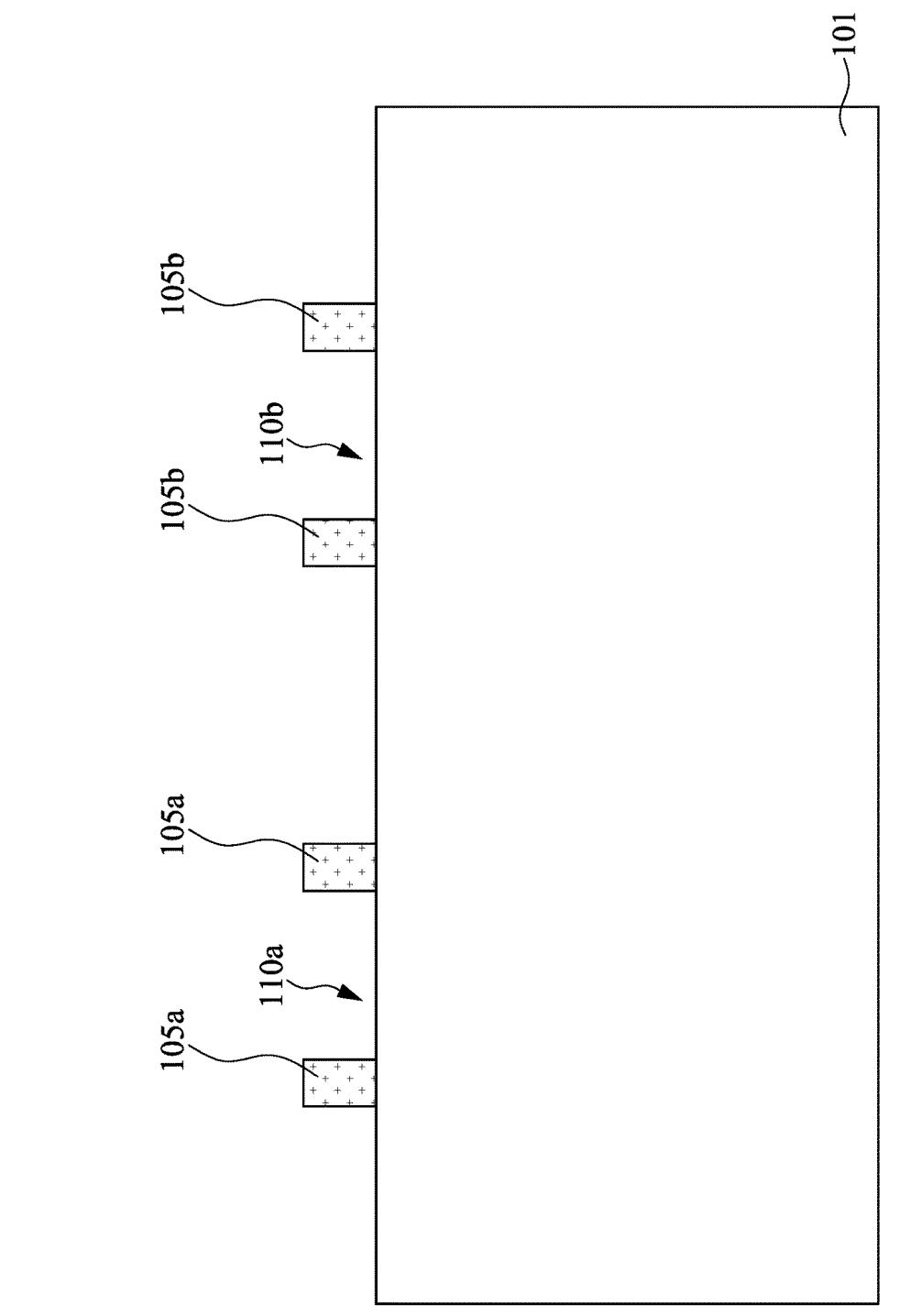
FIG. 5 is a cross-sectional view illustrating an intermediate stage of removing the cylindrical structures during the formation of the semiconductor device along the sectional line I-I' in FIG. 4, in accordance with some embodiments.

FIGS. 2 and 4 are top views illustrating intermediate stages of forming ring structures 105a, 105b over a semiconductor substrate 101 during the formation of the semiconductor device 100, in accordance with some embodiments. FIG. 3 is a cross-sectional view taken along the sectional line I-I' in FIG. 2, and FIG. 5 is a cross-sectional view taken along the sectional line I-I' in FIG. 4, in accordance with some embodiments. The respective step is illustrated as the step S11 in the method 10 shown in FIG. 1.

As shown in FIGS. 2 and 3, a semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates may be fabricated using separation by implantation of oxygen (SIMOX), wafer bonding, and/or other applicable methods.

Still referring to FIGS. 2 and 3, cylindrical structures 103a, 103b are formed over the semiconductor substrate 101, in accordance with some embodiments. In some embodiments, the cylindrical structures 103a and 103b are made of dielectric materials. In some embodiments, the cylindrical structures 103a and 103b include silicon oxide, silicon nitride, silicon carbide, silicon oxynitride, silicon oxycarbide (SiOC), silicon carbonitride (SiCN), silicon oxide carbonitride (SiOCN), another applicable material, or a combination thereof.

In addition, the cylindrical structures 103a and 103b are formed by a deposition process and a patterning process. For example, a material layer (not shown) may be deposited over the semiconductor substrate 101, and the material layer may be patterned to form cylindrical structures 103a and 103b. The deposition process may include a chemical vapor deposition (CVD) process, a physical vapor deposition (PVD)

process, an atomic layer deposition (ALD) process, a spin-on process, another applicable process, or a combination thereof.

In some embodiments, the patterning process includes a photolithography processes and a subsequent etching process. The photolithography process may form photoresist patterns (not shown) on a top surface of the material layer. The photolithography process may include photoresist coating (e.g. spin-on coating), soft baking, mask aligning, exposure, post-exposure baking, developing the photoresist, rinsing and drying (e.g. hard baking). In some embodiments, the etching process is a dry etching process, a wet etching process, or a combination thereof.

Moreover, the ring structures 105a, 105b are formed surrounding the cylindrical structures 103a, 103b, as shown in FIGS. 2 and 3 in accordance with some embodiments. Specifically, sidewalls of the cylindrical structure 103a are entirely surrounded and in direct contact with the ring structure 105a, and sidewalls of the cylindrical structure 103b are entirely surrounded and in direct contact with the ring structure 105b. Some materials and processes used to form the ring structures 105a and 105b are similar to, or the same as, those used to form the cylindrical structures 103a and 103b, and details thereof are not repeated herein. However, it should be noted that, the materials of the ring structures 105a and 105b are different from the materials of the cylindrical structures 103a and 103b.

Then, the cylindrical structure 103a and 103b are removed to form openings 110a and 110b in the ring structures 105a and 105b, as shown in FIGS. 4 and 5 in accordance with some embodiments. In some embodiments, the opening 110a is entirely surrounded by the ring structure 105a, and the opening 110b is entirely surrounded by the ring structure 105b. In some embodiments, the cylindrical structures 103a and 103b are removed by an etching process, such as a dry etching process. As described previously, the materials of the cylindrical structures 103a, 103b are different from the materials of the ring structures 105a, 105b, and the materials are selected such that the etching selectivity of the cylindrical structures 103a, 103b with respect to the ring structures 105a, 105b is high. Therefore, the cylindrical structures 103a and 103b are removed by the etching process while the ring structures 105a and 105b may be substantially left, and the openings 110a and 110b are obtained.

Figure 6:
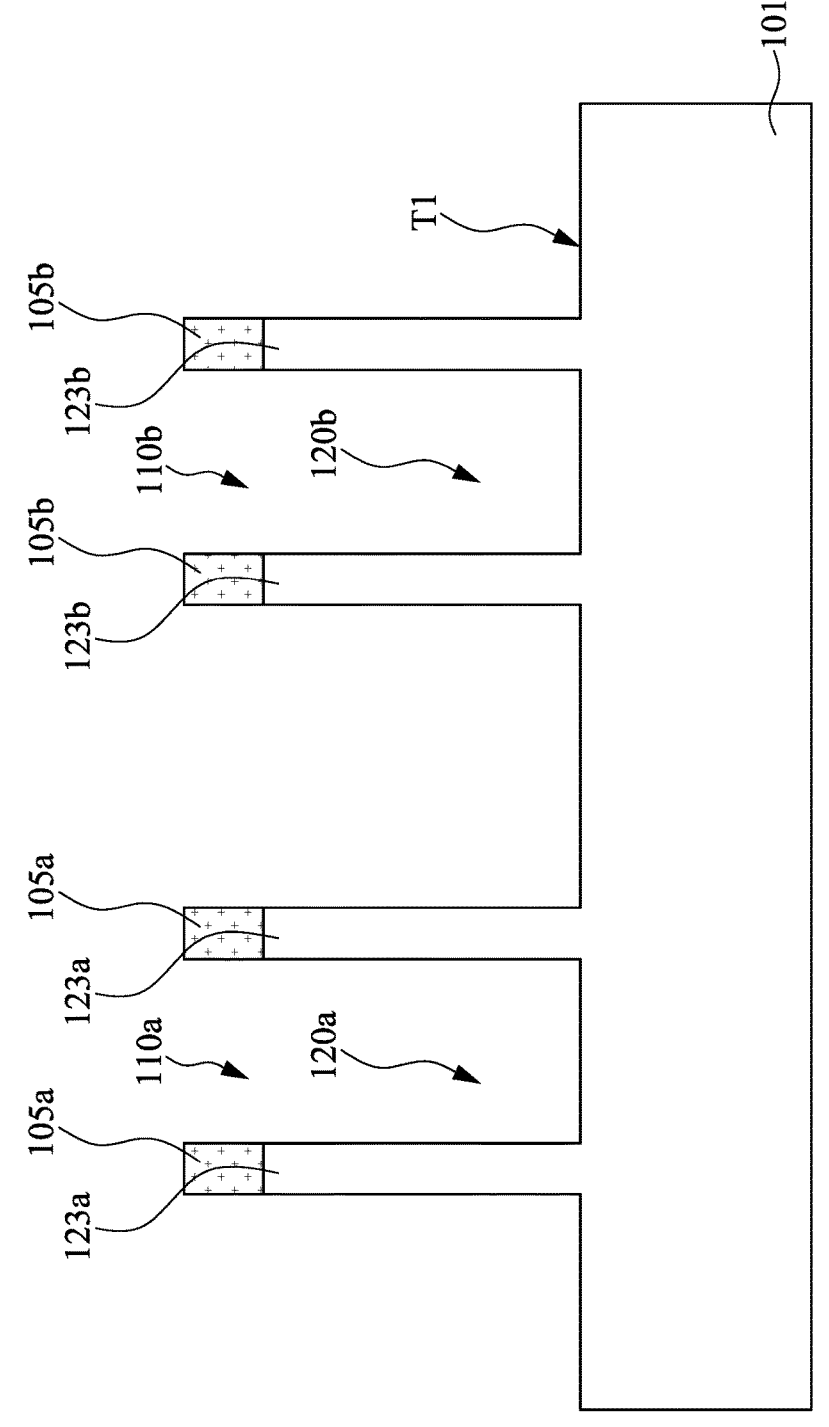
FIG. 6 is a cross-sectional view illustrating an intermediate stage of etching the semiconductor substrate to form annular semiconductor fins during the formation of the semiconductor device, in accordance with some embodiments.

FIG. 6 is a cross-sectional view illustrating an intermediate stage of etching the semiconductor substrate 101 to form annular semiconductor fins 123a and 123b during the formation of the semiconductor device 100, in accordance with some embodiments. The respective step is illustrated as the step S13 in the method 10 shown in FIG. 1. The annular semiconductor fins 123a and 123b are also referred to as annular vertical fins or tubular vertical fins.

Subsequently, the semiconductor substrate 101 is etched by using the ring structures 105a and 105b as a mask to form the annular semiconductor fins 123a and 123b, as shown in FIG. 6 in accordance with some embodiments. In some embodiments, openings 120a and 120b under the openings 110a and 110b are formed in the semiconductor substrate 101 and surrounded by the annular semiconductor fins 123a and 123b. Moreover, the top surface T1 of the semiconductor substrate 101 is exposed by the annular semiconductor fins 123a and 123b. In some embodiments, the semiconductor substrate 101 is etched by a dry etching process or a wet etching process.

Figure 7:
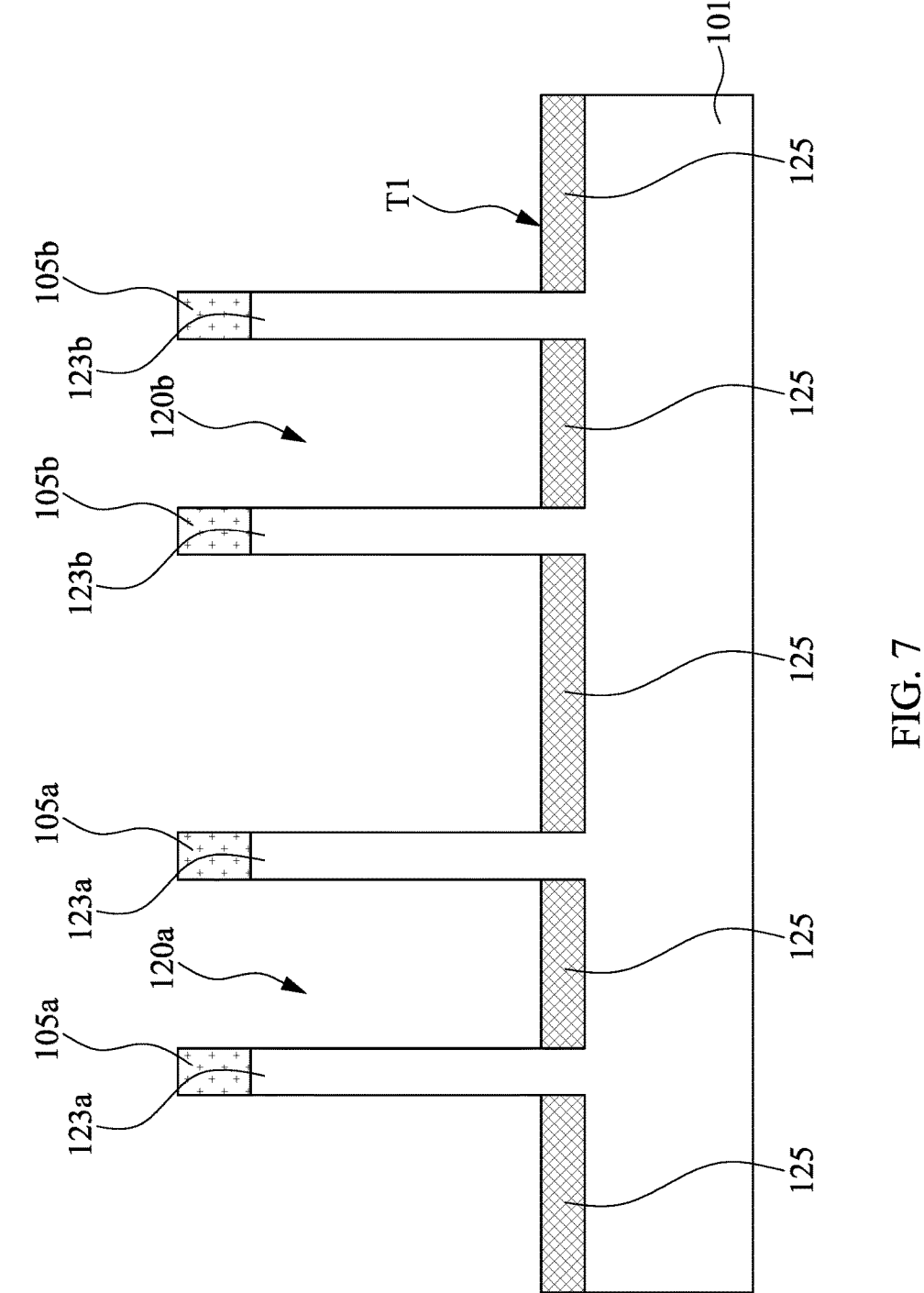
FIG. 7 is a cross-sectional view illustrating an intermediate stage of forming a processed area during the formation of the semiconductor device, in accordance with some embodiments.

FIG. 7 is a cross-sectional view illustrating an intermediate stage of forming a processed area 125 during the formation of the semiconductor device 100, in accordance with some embodiments. The respective step is illustrated as the step S15 in the method 10 shown in FIG. 1. The processed area 125 is formed by performing an ion implantation process on the semiconductor substrate 101, as shown in FIG. 7 in accordance with some embodiments.

In some embodiments, dopants are implanted into the top surface T1 of the semiconductor substrate 101 exposed by the annular semiconductor fins 123a and 123b. In some embodiments, P-type dopants, such as boron (B), gallium (Ga), or indium (In), or N-type dopants, such as phosphorous (P) or arsenic (As), can be implanted to form the processed area 125, depending on design requirements of the semiconductor device 100. It should be noted that the annular semiconductor fins 123a and 123b are covered by the ring structures 105a and 105b during the formation of the processed area 125.

Figure 8:
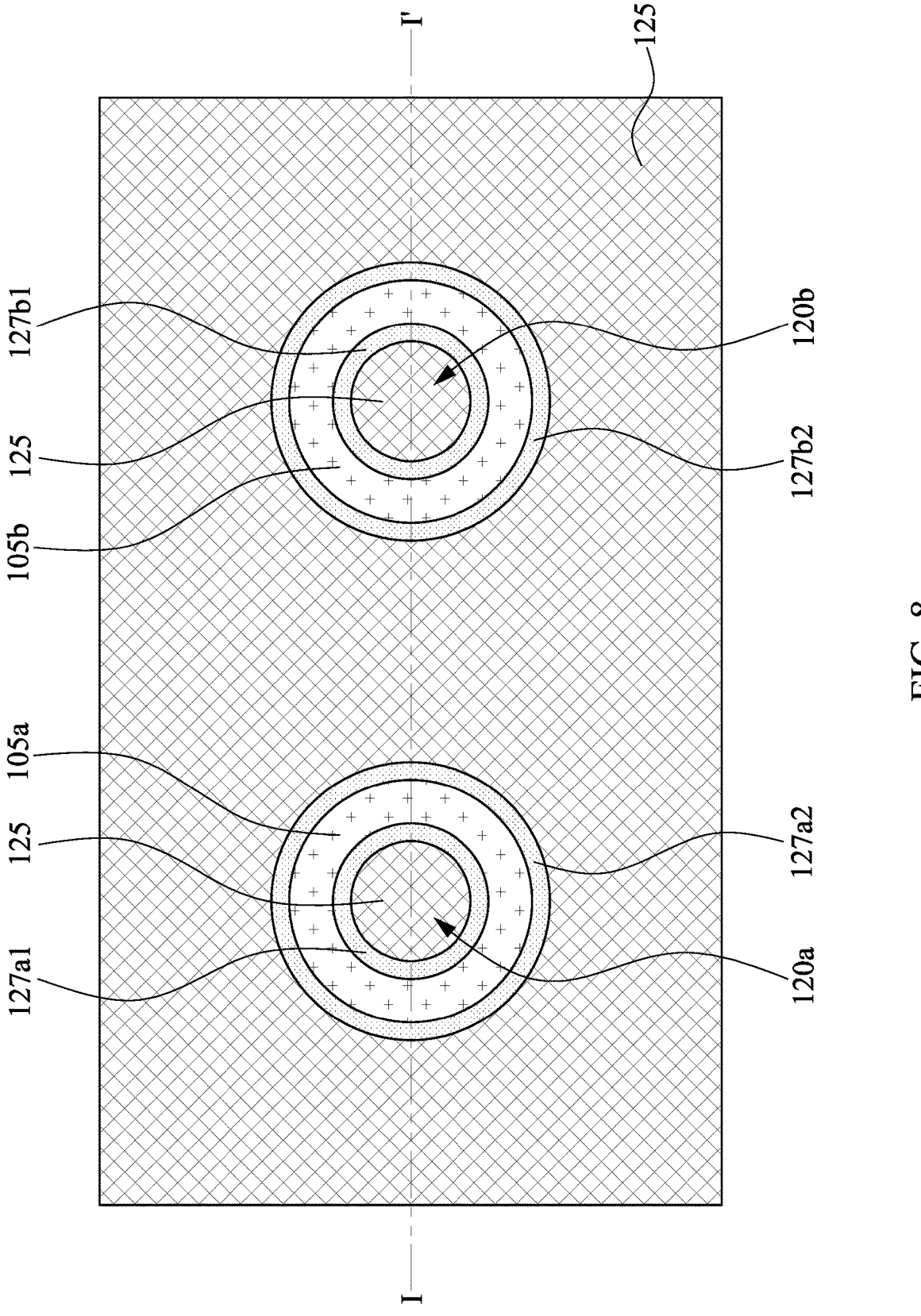
FIG. 8 is a top view illustrating an intermediate stage of forming inner spacers and outer spacers during the formation of the semiconductor device, in accordance with some embodiments.
Figure 9:
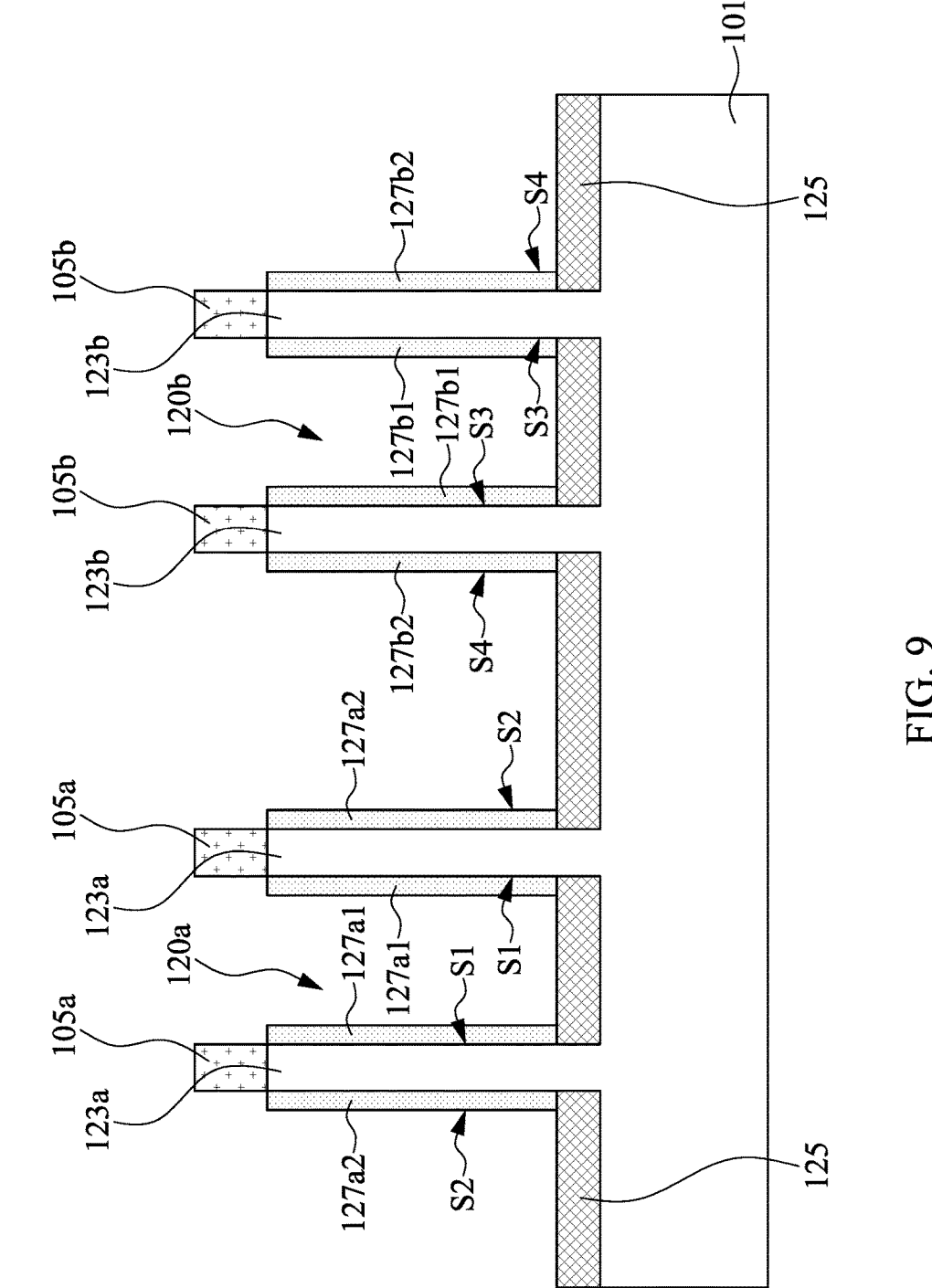
FIG. 9 is a cross-sectional view illustrating an intermediate stage of forming inner spacers and outer spacers during the formation of the semiconductor device along the sectional line I-I' in FIG. 8, in accordance with some embodiments.

FIG. 8 is a top view illustrating an intermediate stage of forming inner spacers 127a1, 127b1 and outer spacers 127a2, 127b2 during the formation of the semiconductor device 100, and FIG. 9 is cross-sectional view taken along the sectional line I-I' in FIG. 8, in accordance with some embodiments. The respective step is illustrated as the step S17 in the method 10 shown in FIG. 1.

More specifically, the inner spacer 127a1 is formed on and in direct contact with an inner sidewall S1 of the annular semiconductor fin 123a, and the outer spacer 127a2 is formed on and in direct contact with an outer sidewall S2 of the annular semiconductor fin 123a. Similarly, the inner spacer 127b1 is formed on and in direct contact with an inner sidewall S3 of the annular semiconductor fin 123b, and the outer spacer 127b2 is formed on and in direct contact with an outer sidewall S4 of the annular semiconductor fin 123b. In other words, the inner spacers 127a1 and 127b1 are formed in the openings 120a and 120b, respectively. In some embodiments, the processed area 125 is partially covered by the inner spacers 127a1, 127b1 and the outer spacers 127a2, 127b2.

In some embodiments, the inner spacers 127a1, 127b1 and the outer spacers 127a2, 127b2 are made of dielectric materials. In some embodiments, the inner spacers 127a1, 127b1 and the outer spacers 127a2, 127b2 include silicon oxide, silicon nitride, silicon carbide, silicon oxynitride, silicon oxycarbide (SiOC), silicon carbonitride (SiCN), silicon oxide carbonitride (SiOCN), another applicable material, or a combination thereof. In some embodiments, the materials of the inner spacers 127a1, 127b1 and the materials of the outer spacers 127a2, 127b2 are different from the materials of the ring structures 105a and 105b. In some embodiments, the materials of the inner spacers 127a1, 127b1 and the materials of the outer spacers 127a2, 127b2 are the same. In addition, the inner spacers 127a1, 127b1 and the outer spacers 127a2, 127b2 are formed by selectively growing or depositing a dielectric material over the sidewalls of the annular semiconductor fins 123a, 123b. In some embodiments, the inner spacers 127a1, 127b1 and the outer spacers 127a2, 127b2 are formed by an epitaxial (epi) process.

Figure 11:
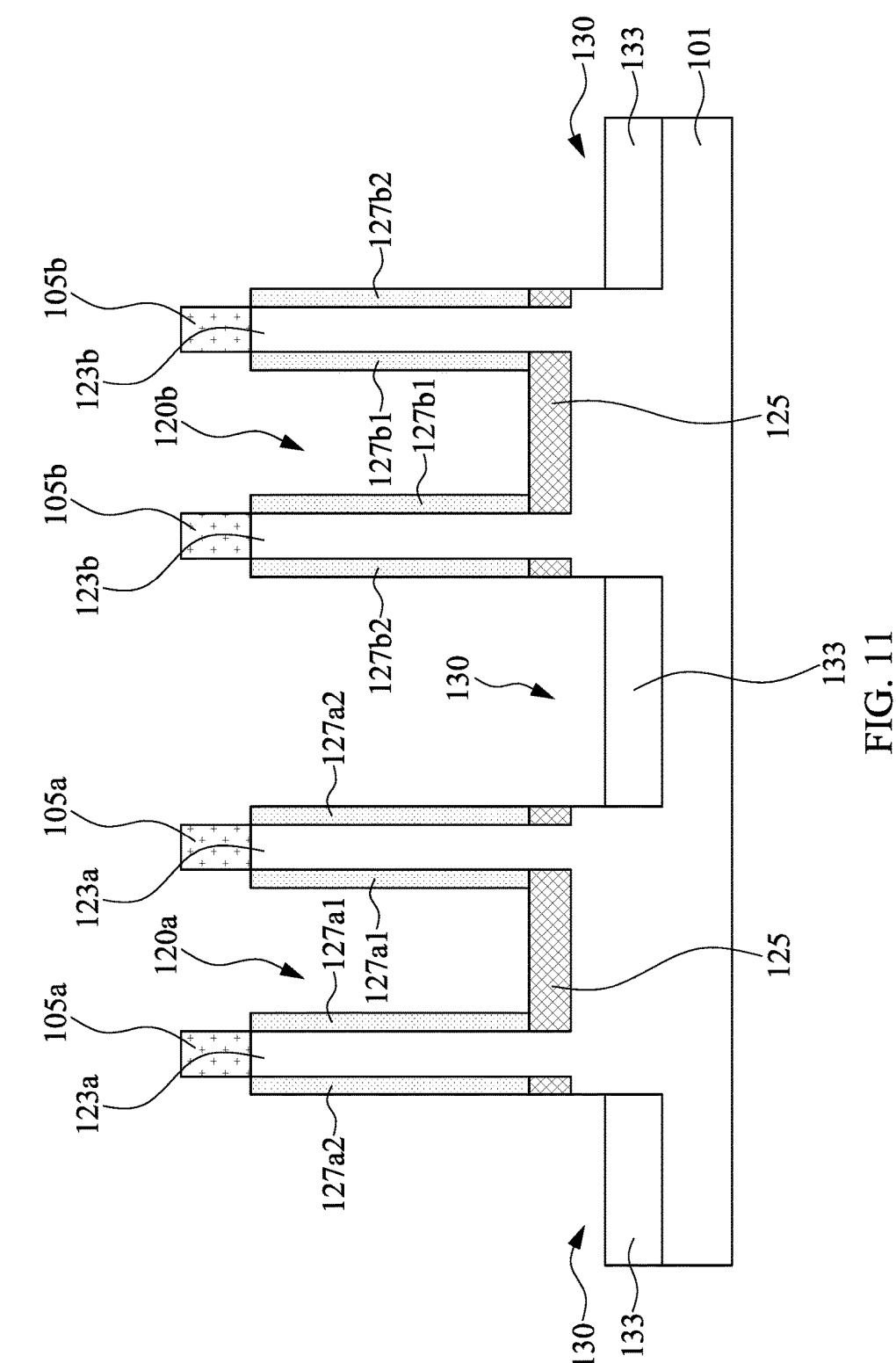
FIG. 11 is a cross-sectional view illustrating an intermediate stage of forming an isolation structure in the recess during the formation of the semiconductor device, in accordance with some embodiments.
Figure 12:
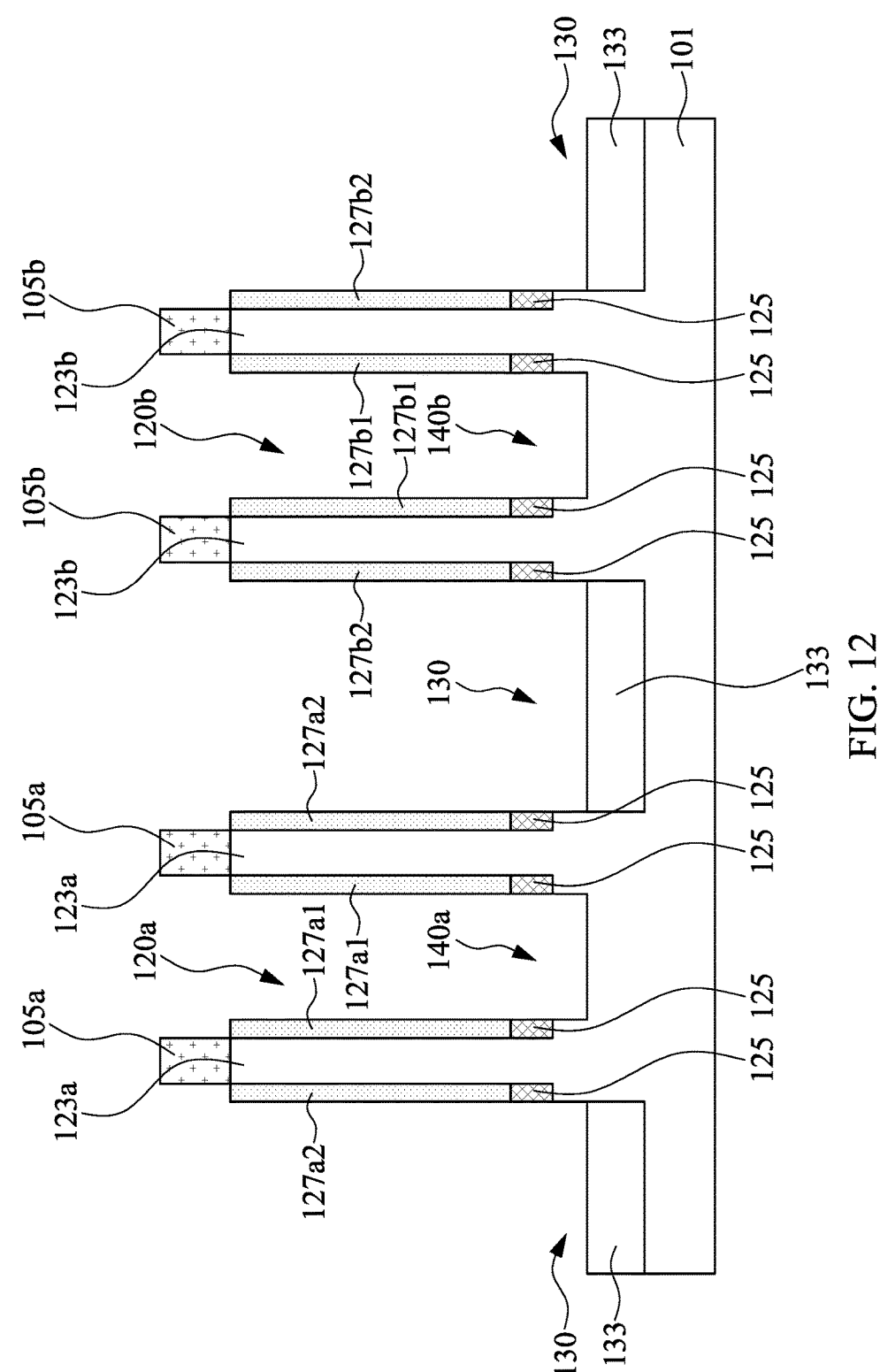
FIG. 12 is a cross-sectional view illustrating an intermediate stage of etching the semiconductor substrate to form recesses within the annular semiconductor fins during the formation of the semiconductor device, in accordance with some embodiments.
Figure 13:
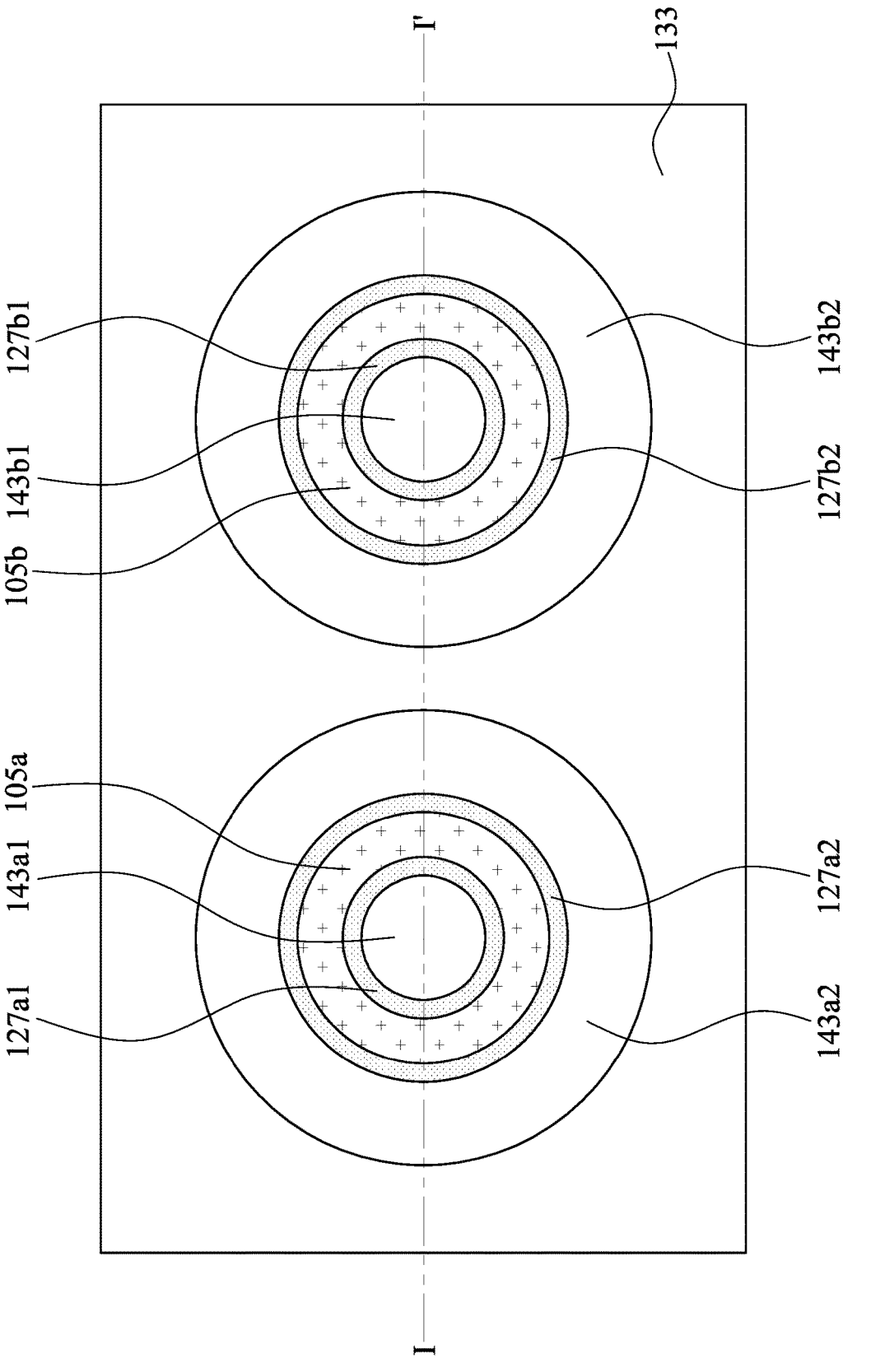
FIG. 13 is a top view illustrating an intermediate stage of forming first and second bottom source/drain structures during the formation of the semiconductor device, in accordance with some embodiments.
Figure 14:
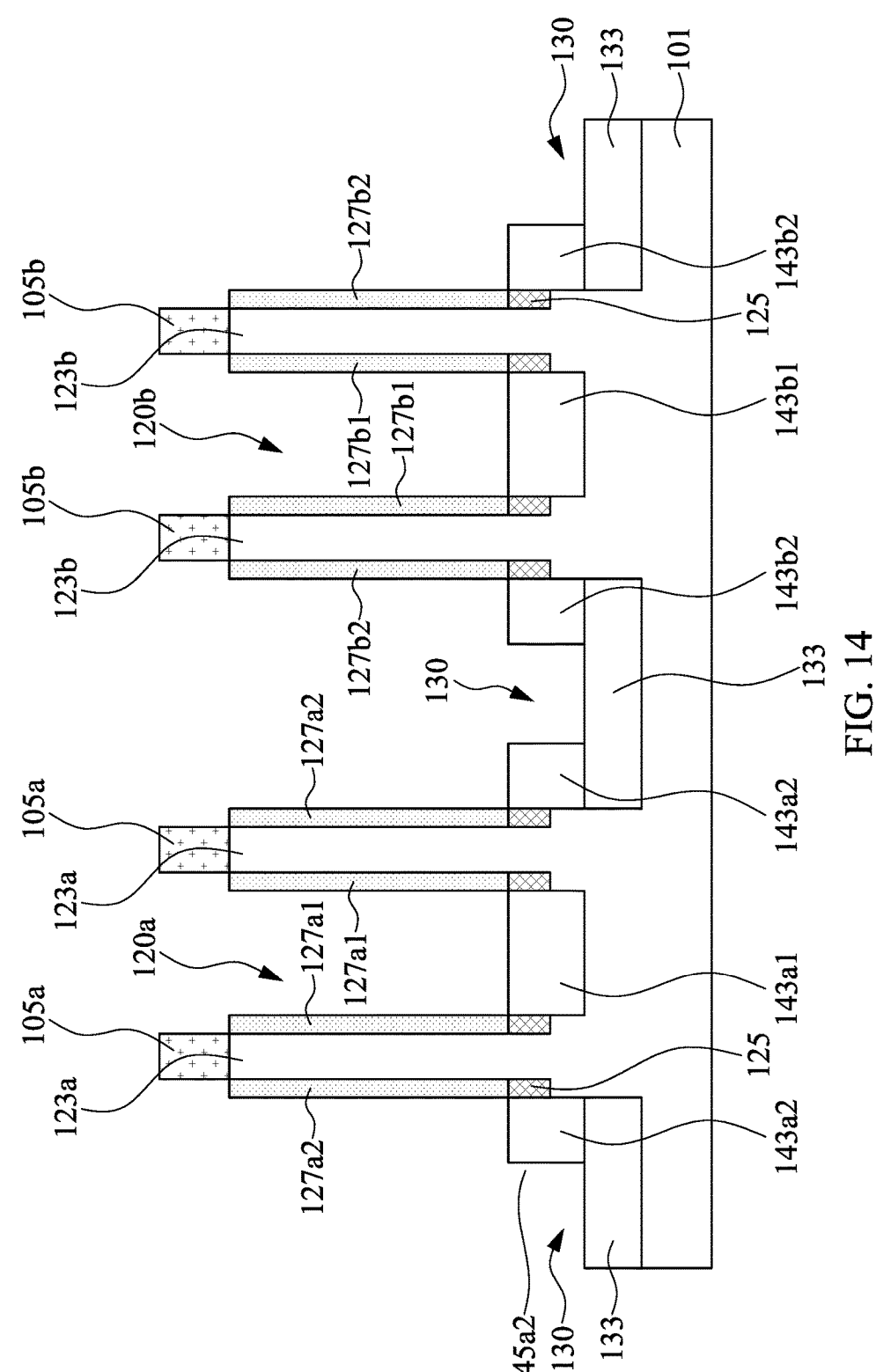
FIG. 14 is a cross-sectional view illustrating an intermediate stage of forming first and second bottom source/drain structures during the formation of the semiconductor device along the sectional line I-I' in FIG. 13, in accordance with some embodiments.

FIGS. 10, 11, 12, and 14 are cross-sectional views illustrating intermediate stages of epitaxially growing bottom source/drain structures 143a1, 143a2, 143b1, 143b2 during the formation of the semiconductor device 100, and FIG. 14 is a cross-sectional view taken along the sectional line I-I' in the top view of FIG. 13, in accordance with some embodiments. The respective step is illustrated as the step S19 in the method 10 shown in FIG. 1.

Figure 10:
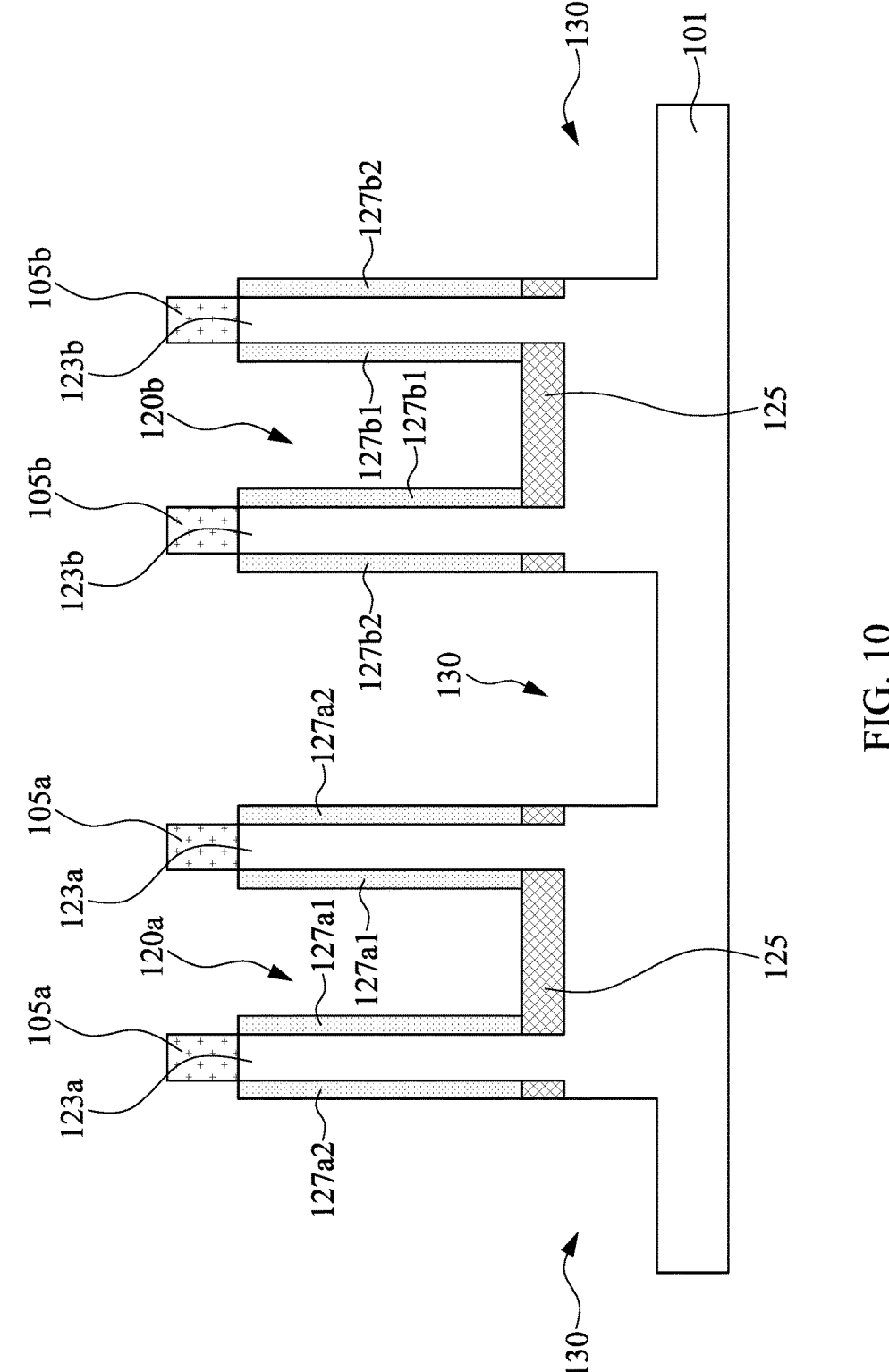
FIG. 10 is a cross-sectional view illustrating an intermediate stage of etching the semiconductor substrate to form a recess surrounding the annular semiconductor fins during the formation of the semiconductor device, in accordance with some embodiments.

As shown in FIG. 10, the semiconductor substrate 101 is etched to form a recess 130 surrounding the annular semiconductor fins 123a and 123b, in accordance with some embodiments. In some embodiments, the processed area 125 in the semiconductor substrate 101 is partially etched. In some embodiments, the recess 130 is formed by a dry etching process, such as a directional reactive-ion etching (RIE) process. In some embodiments, portions of the semiconductor substrate 101 (including the processed area 125) surrounded by the annular semiconductor fins 123a and 123b are not recessed by the etching process due to the loading effect.

Next, an isolation structure 133 is formed in the recess 130, as shown in FIG. 11 in accordance with some embodiments. In some embodiments, the isolation structure 133 is made of an insulating material, such as silicon oxide, silicon nitride, silicon oxynitride or another applicable dielectric material. In some embodiments, an insulating material (not shown) is deposited in the recess 130, and an etch-back process is performed on the insulating material to form the isolation structure 133. In some embodiments, a top surface of the isolation structure 133 is lower than the top surface of the processed area 125.

After the isolation structure 133 is formed, the semiconductor substrate 101 is etched to form recesses 140a and 140b within the annular semiconductor fins 123a and 123b, as shown in FIG. 12 in accordance with some embodiments. In some embodiments, portions of the semiconductor substrate 101 (including the processed area 125) within the annular semiconductor fins 123a and 123b are etched by using the ring structures 105a, 105b, the inner spacers 127a1, 127b1, and the outer spacers 127a2, 127b2 as a mask, and the portion of the semiconductor substrate 101 covered by the isolation structure 133 is protected by the isolation structure 133. In some embodiments, the etching process includes a dry etching process, such as an RIE process.

In some embodiments, the portions of the semiconductor substrate 101 within the annular semiconductor fins 123a and 123b are recessed to be coplanar with the isolation structure 133. However, other recess dimensions are applicable as well. In some embodiments, the sidewalls of the processed area 125 are exposed by the recesses 130, 140a, and 140b.

After the recesses 130, 140a, and 140b are formed in the semiconductor substrate 101 and below the annular semiconductor fins 123a and 123b, first bottom source/drain structures 143a1, 143b1 are epitaxially grown in the recesses 140a, 140b (see FIG. 12), respectively, and second bottom source/drain structures 143a2, 143b2 are epitaxially grown in the recess 130, as shown in FIGS. 13 and 14 in accordance with some embodiments. In some embodiments, the first bottom source/drain structure 143a1 is within the annular semiconductor fin 123a, and the second source/drain structure 143a2 is surrounding the annular semiconductor fin 123a. Similarly, the first bottom source/drain structure 143b1 is within the annular semiconductor fin 123b, and the second source/drain structure 143b2 is surrounding the annular semiconductor fin 123b.

In some embodiments, the inner spacer 127a1 and the outer spacer 127a2 are between the first bottom source/drain structure 143a1 and the second bottom source/drain structure 143a2, and the inner spacer 127b1 and the outer spacer 127b2 are between the first bottom source/drain structure 143b1 and the second bottom source/drain structure 143b2. In some embodiments, the first bottom source/drain structures 143a1, 143b1 and the second bottom source/drain structures 143a2, 143b2 are in direct contact with the processed area 125, and the second bottom source/drain structures 143a2, 143b2 cover a portion of the isolation structure 133.

In some embodiments, a strained material is grown over the recessed portions of the semiconductor substrate 101 by an epitaxial process to form the first bottom source/drain structures 143a1, 143b1 and the second bottom source/drain structures 143a2, 143b2. In some embodiments, the first bottom source/drain structures 143a1, 143b1 and the second bottom source/drain structures 143a2, 143b2 include Ge, SiGe, InAs, InGaAs, InSb, GaAs, GaSb, InAlP, InP, or the like. The epitaxial process may include a rapid thermal chemical vapor deposition (RTCVD) process, an ultra-high vacuum chemical vapor deposition (UHVCVD) process, a molecular beam epitaxy (MBE) process, a metal organic CVD (MOCVD) or another applicable process.

Figure 15:
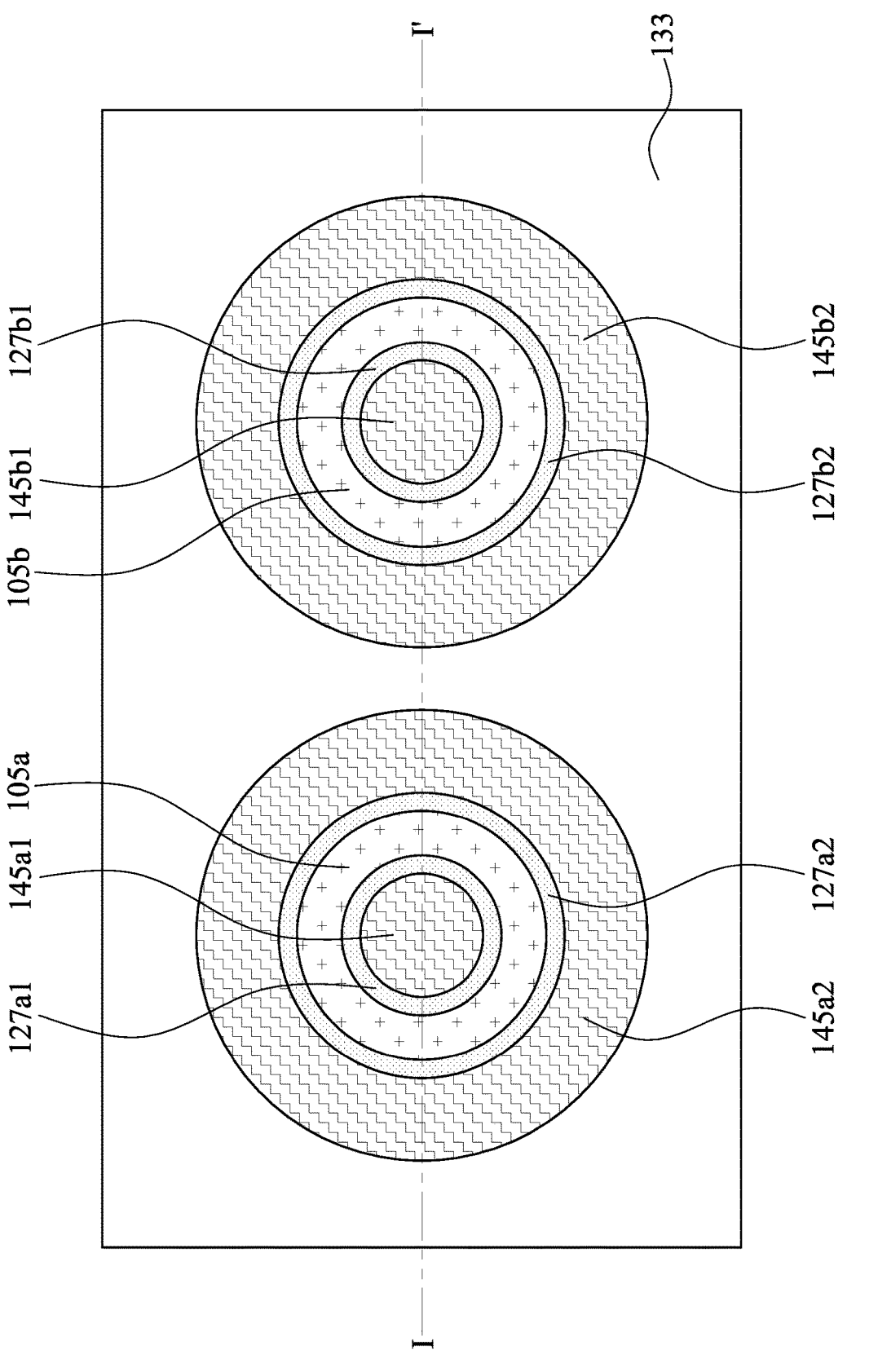
FIG. 15 is a top view illustrating an intermediate stage of forming first and second silicide layers during the formation of the semiconductor device, in accordance with some embodiments.
Figure 16:
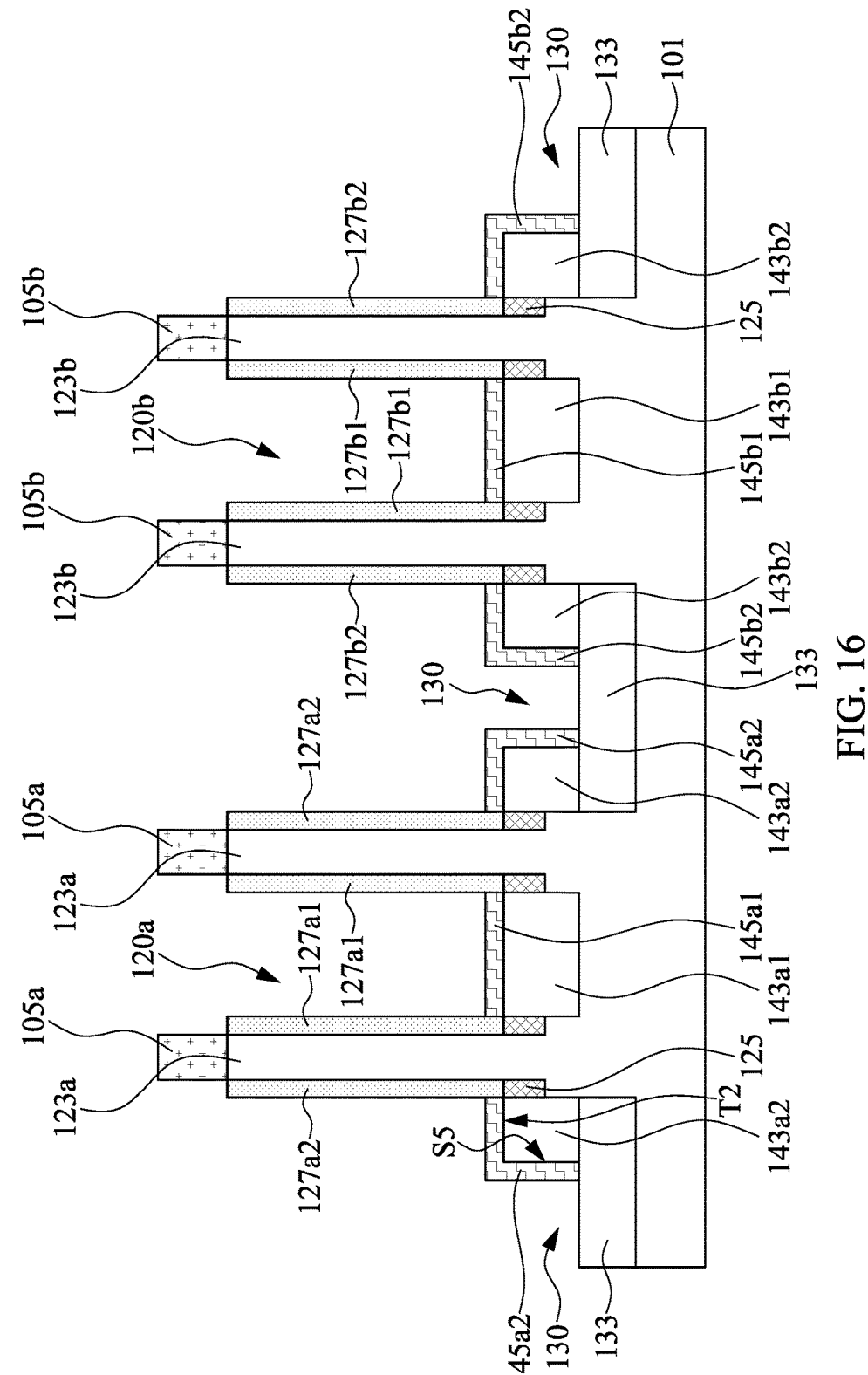
FIG. 16 is a cross-sectional view illustrating an intermediate stage of forming first and second silicide layers during the formation of the semiconductor device along the sectional line I-I' in FIG. 15, in accordance with some embodiments.

FIG. 15 is a top view illustrating an intermediate stage of forming first silicide layers 145a1, 145b1 and second silicide layers 145a2, 145b2 during the formation of the semiconductor device 100, and FIG. 16 is cross-sectional view taken along the sectional line I-I' in FIG. 15, in accordance with some embodiments. The respective step is illustrated as the step S21 in the method 10 shown in FIG. 1. The first silicide layer 145a1 is formed to cover the first bottom source/drain structure 143a1, and the second silicide layer 145a2 is formed to cover and surround the second bottom source/drain structure 143a2. Similarly, the first silicide layer 145b1 is formed to cover the first bottom source/drain structure 143b1, and the second silicide layer 145b2 is formed to cover and surround the second bottom source/drain structure 143b2.

In some embodiments, the first silicide layer 145a1 is in direct contact with the top surface of the first bottom source/drain structure 143a1, and the second silicide layer 145a2 is in direct contact with the top surface and sidewalls of the second bottom source/drain structure 143a2, such as the top surface T2 and the sidewall S5 of the second bottom source/drain structure 143a2 as shown in FIG. 16. The first silicide layer 145b1, the first bottom source/drain structure 143b1, the second silicide layer 145b2, and the second bottom source/drain structure 143b2 have similar features as the above-mentioned features of the first silicide layer 145a1, the first bottom source/drain structure 143a1, the second silicide layer 145a2, and the second bottom source/drain structure 143a2, and details thereof are not repeated herein.

Moreover, in some embodiments, the first silicide layers 145a1 and 145b1 are in direct contact with the inner spacers 127a1 and 127b1, respectively, and the second silicide layers 145a2 and 145b2 are in direct contact with the outer spacers 127a2 and 127b2, respectively. It should be noted that the first silicide layers 145a1 and 145b1 and the second silicide layers 145a2 and 145b2 are used to reduce contact resistance between the bottom source/drain structures and the contacts which will later be formed over the bottom source/drain structures.

In some embodiments, the first silicide layers 145a1, 145b1 and the second silicide layers 145a2, 145b2 are made of a metal silicide material, such as cobalt silicide, titanium silicide, tantalum silicide, nickel silicide, copper silicide, tungsten silicide, molybdenum silicide, or another applicable material. In addition, the first silicide layers 145a1, 145b1 and the second silicide layers 145a2, 145b2 may be formed by a silicidation process. In some embodiments, the silicidation process includes a metal material deposition process and an annealing process performed in sequence. In some embodiments, the deposition process of the silicidation process includes a PVD process, an ALD process, or another applicable process. In some embodiments, the annealing process of the silicidation process is performed at a temperature in a range from about 400° C. to about 700° C. After the annealing process, the unreacted metal material is removed.

Figure 17:
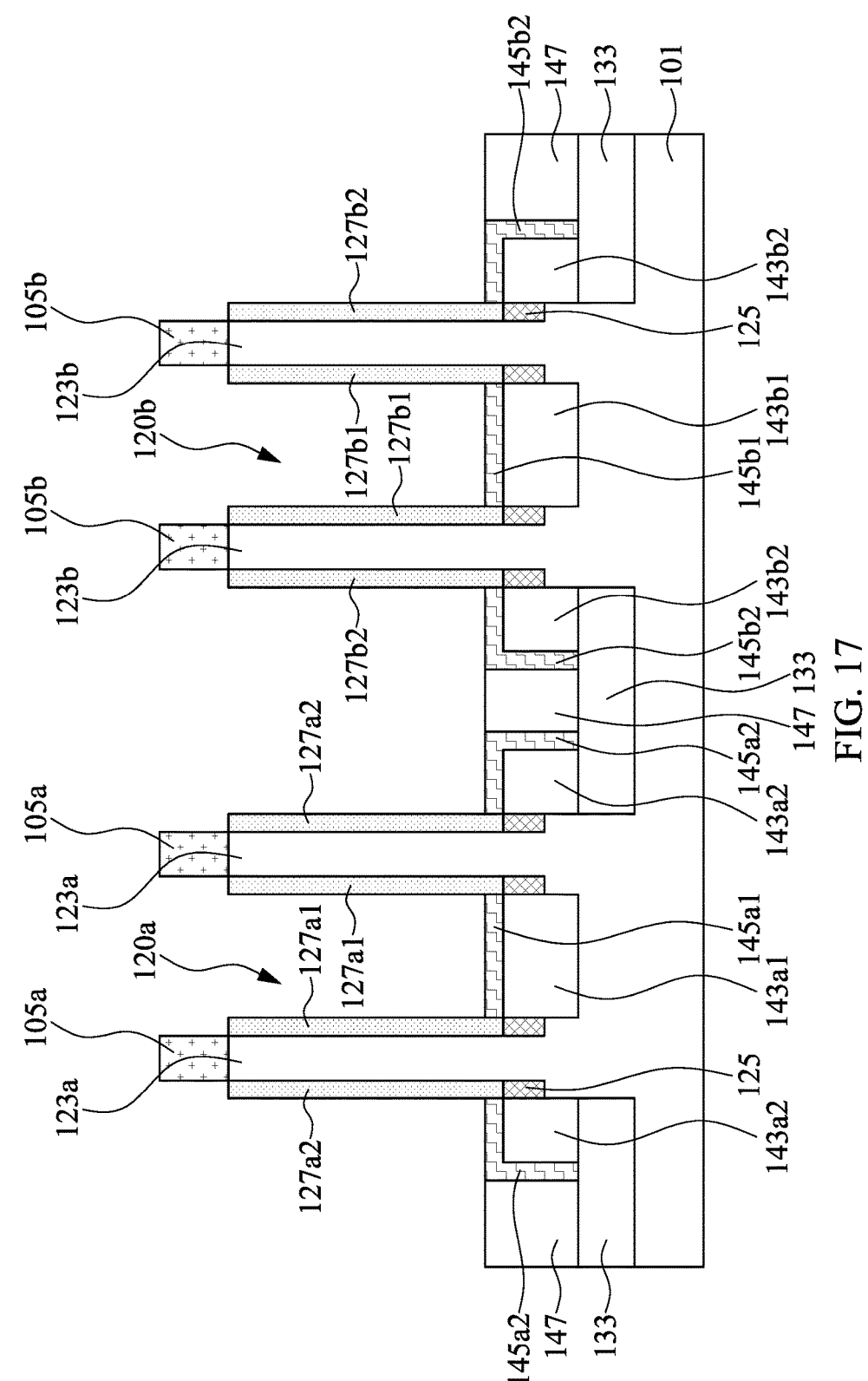
FIG. 17 is a cross-sectional view illustrating an intermediate stage of forming an interlayer dielectric (ILD) layer to surround the second silicide layers during the formation of the semiconductor device, in accordance with some embodiments.

FIG. 17 is a cross-sectional view illustrating an intermediate stage of forming an interlayer dielectric (ILD) layer 147 to surround the second silicide layers 145*a*2, 145*b*2 during the formation of the semiconductor device 100, in accordance with some embodiments. As shown in FIG. 17, the ILD layer 147 is formed to fill the remaining space of the recess 130, in accordance with some embodiments.

In some embodiments, the ILD layer 147 may include multilayers made of multiple dielectric materials, such as silicon oxide, silicon nitride, silicon oxynitride, tetraethoxysilane (TEOS) oxide, phosphosilicate glass (PSG), borophosphosilicate glass (BPSG), low-k dielectric material, and/or other applicable dielectric materials. The ILD layer 147 may be formed by a CVD process, a PVD process, an ALD process, a spin-on coating process, or another applicable process. In some embodiments, a planarization process, such as a chemical mechanical polishing (CMP) process, is performed on the ILD layer 147 until the top surfaces of the second silicide layers 145*a*2 and 145*b*2 are exposed.

Figure 18:
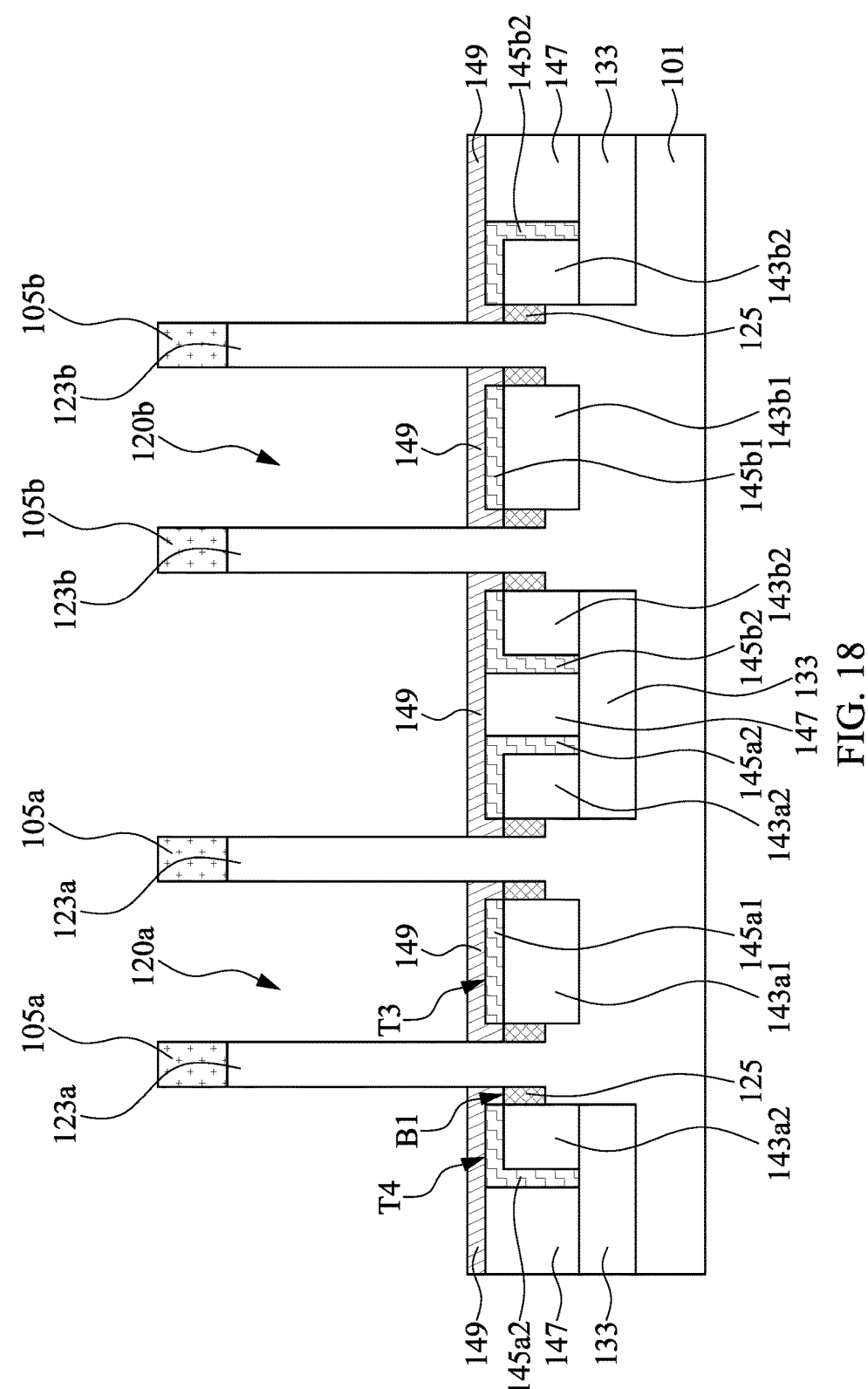
FIG. 18 is a cross-sectional view illustrating an intermediate stage of forming a bottom spacer layer to cover the first and the second silicide layers during the formation of the semiconductor device, in accordance with some embodiments.

FIG. 18 is a cross-sectional view illustrating an intermediate stage of removing the inner spacers 127*a*1, 127*b*1 and the outer spacers 127*a*2, 127*b*2, and forming a bottom spacer layer 149 to cover the first silicide layers 145*a*1, 145*b*1 and the second silicide layers 145*a*2, 145*b*2 during the formation of the semiconductor device 100, in accordance with some embodiments. The respective step is illustrated as the step S23 in the method 10 shown in FIG. 1. In some embodiments, after the inner spacers 127*a*1, 127*b*1 and the outer spacers 127*a*2, 127*b*2 are removed, annular gaps (not shown) are formed within the annular semiconductor fins 123*a* and 123*b*, and surrounding the annular semiconductor fins 123*a* and 123*b*.

In some embodiments, the inner spacers 127*a*1, 127*b*1 and the outer spacers 127*a*2, 127*b*2 are removed by a selective etching process, such as an RIE process. The removal of the inner spacers 127*a*1, 127*b*1 and the outer spacers 127*a*2, 127*b*2 exposes the sidewalls of the annular semiconductor fins 123*a* and 123*b* (i.e., the inner sidewalls S1, S3 and the outer sidewalls S2, S4 shown in FIG. 9). Then, the bottom spacer layer 149 is deposited over the first silicide layers 145*a*1, 145*b*1 and the second silicide layers 145*a*2, 145*b*2, and portions of the bottom spacer layer 149 extend into the annular gaps between the first silicide layers 145*a*1, 145*b*1, the second silicide layers 145*a*2, 145*b*2 and the annular semiconductor fins 123*a*, 123*b*, as shown in FIG. 18 in accordance with some embodiments.

In some embodiments, the bottom spacer layer 149 is made of a dielectric material, such as silicon oxide, silicon nitride, silicon carbide, silicon oxynitride, silicon oxycarbide (SiOC), silicon carbonitride (SiCN), silicon oxide carbonitride (SiOCN), another applicable material, or a combination thereof. In addition, the bottom spacer layer 149 is formed by a directional deposition process, such as a high density plasma (HDP) deposition process, a gas cluster ion beam (GCIB) deposition process, or another applicable deposition process. The directional deposition process deposits the material of the bottom spacer layer 149 preferably on the exposed horizontal surfaces, but not on the lateral sidewalls. In some embodiments, the material of the bottom spacer layer 149 formed over the top surfaces of the ring structures 105*a* and 105*b* will later be removed during subsequent planarization process, such as a CMP process.

Figure 19:
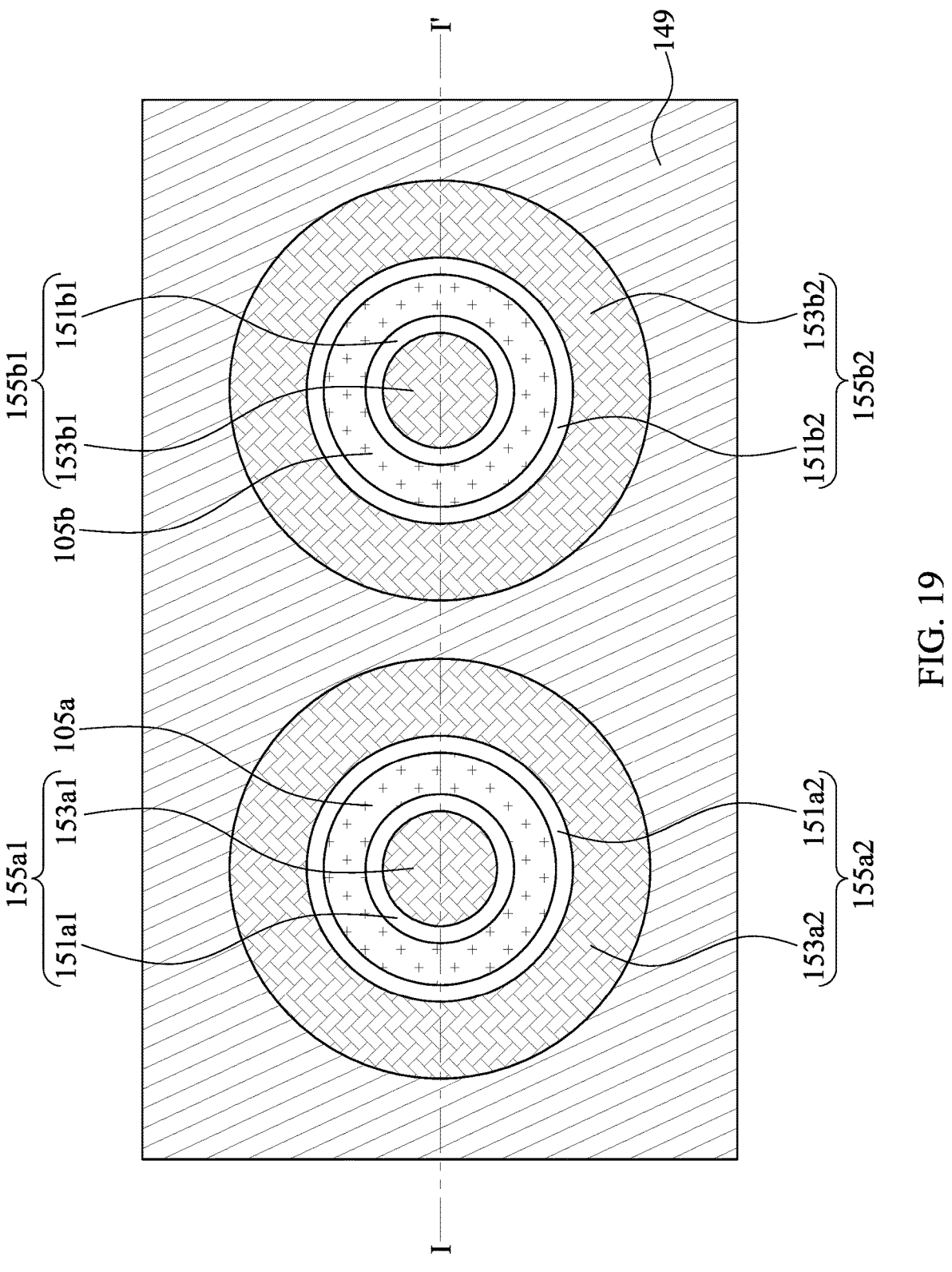
FIG. 19 is a top view illustrating an intermediate stage of forming first and second gate structures during the formation of the semiconductor device, in accordance with some embodiments.
Figure 20:
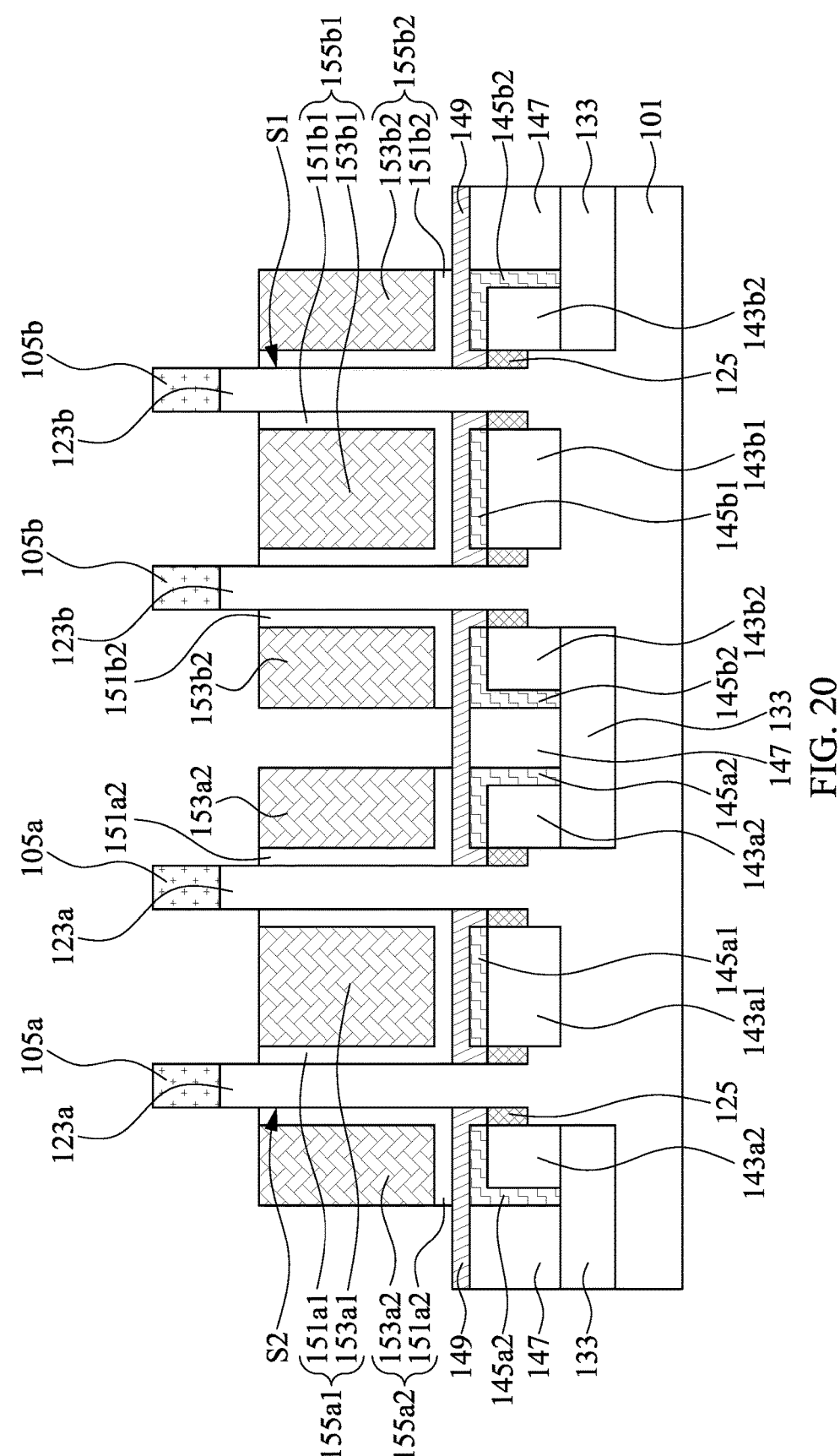
FIG. 20 is a cross-sectional view illustrating an intermediate stage of forming first and second gate structures during the formation of the semiconductor device along the sectional line I-I' in FIG. 19, in accordance with some embodiments.

FIG. 19 is a top view illustrating an intermediate stage of forming first gate structures 155*a*1, 155*b*1 and second gate structures 155*a*2, 155*b*2 during the formation of the semiconductor device 100, and FIG. 20 is cross-sectional view taken along the sectional line I-I' in FIG. 19, in accordance with some embodiments. The respective step is illustrated as the step S25 in the method 10 shown in FIG. 1. The first gate structure 155*a*1 includes a gate dielectric layer 151*a*1 and a gate electrode layer 153*a*1, and the second gate structure 155*a*2 includes a gate dielectric layer 151*a*2 and a gate electrode layer 153*a*2. Similarly, the first gate structure 155*b*1 includes a gate dielectric layer 151*b*1 and a gate electrode layer 153*b*1, and the second gate structure 155*b*2 includes a gate dielectric layer 151*b*2 and a gate electrode layer 153*b*2.

In some embodiments, the gate electrode layers 153*a*1, 153*a*2, 153*b*1, and 153*b*2 are formed over the gate dielectric layers 151*a*1, 151*a*2, 151*b*1, and 151*b*2, and sidewalls of the gate electrode layers 153*a*1, 153*a*2, 153*b*1, and 153*b*2 are covered by the gate dielectric layers 151*a*1, 151*a*2, 151*b*1, and 151*b*2. In addition, work function layers (not shown) may be formed between each of the gate dielectric layers 151*a*1, 151*a*2, 151*b*1, and 151*b*2 and each of the gate electrode layers 153*a*1, 153*a*2, 153*b*1, and 153*b*2.

Each of the gate dielectric layers 151*a*1, 151*a*2, 151*b*1, and 151*b*2 may be a single layer or multiple layers. In some embodiments, the gate dielectric layers 151*a*1, 151*a*2, 151*b*1, and 151*b*2 are made of silicon oxide, silicon nitride, silicon oxynitride (SiON), dielectric material(s) with high dielectric constant (high-k), or a combination thereof. In some embodiments, the gate dielectric layers 151*a*1, 151*a*2, 151*b*1, and 151*b*2 are deposited by an ALD process, a plasma enhanced chemical vapor deposition (PECVD) process or a spin coating process.

Moreover, the gate electrode layers 153*a*1, 153*a*2, 153*b*1, and 153*b*2 are made of a conductive material such as aluminum (Al), copper (Cu), tungsten (W), titanium (Ti), tantalum (Ta), or another applicable material, in accordance with some embodiments. The gate electrode layers 153*a*1, 153*a*2, 153*b*1, and 153*b*2 may be formed by a deposition process, such as a CVD process, a PVD process, an ALD process, a high density plasma CVD (HDPCVD) process, an MOCVD process, or a PECVD process.

The work function layers (not shown) may be made of metal materials, and the metal materials may include N-work-function metal or P-work-function metal, depending on design requirements of the semiconductor device 100. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal may include titanium nitride (TiN), tungsten nitride (WN), tantalum nitride (TaN), ruthenium (Ru) or a combination thereof.

After the materials of the gate dielectric layers 151*a*1, 151*a*2, 151*b*1, and 151*b*2 and the gate electrode layers 153*a*1, 153*a*2, 153*b*1, and 153*b*2 are deposited, excessive materials of the gate dielectric layers 151*a*1, 151*a*2, 151*b*1, and 151*b*2 and the gate electrode layers 153*a*1, 153*a*2, 153*b*1, and 153*b*2 are removed by a single etching process or multiple etching processes, such as dry etching processes, to form the first gate structures 155*a*1 and 155*b*1 within the annular semiconductor fins 123*a* and 123*b*, and the second gate structures 155*a*2 and 155*b*2 surrounding the annular semiconductor fins 123*a* and 123*b*. As a result, the inner sidewall S1 of the annular semiconductor fin 123*a* is in direct contact with the gate dielectric layer 151*a*1 of the first gate structure 155*a*1, and the outer sidewall S2 of the annular semiconductor fin 123*a* is in direct contact with the gate dielectric layer 151*a*2 of the second gate structure 155*a*2.

In some embodiments, the inner sidewall S1 and the outer sidewall S2 of the annular semiconductor fin 123*a* are partially exposed by the first gate structure 155*a*1 and the second gate structure 155*a*2. The annular semiconductor fin 123*b*, the first gate structure 155*b*1, and the second gate structure 155*b*2 have similar features as the above-mentioned features of the annular semiconductor fin 123*a*, the first gate structure 155*a*1, and the second gate structure 155*a*2, and details thereof are not repeated herein. In some embodiments, a portion of the bottom spacer layer 149 is exposed by the second gate structures 155*a*2 and 155*b*2.

Figure 21:
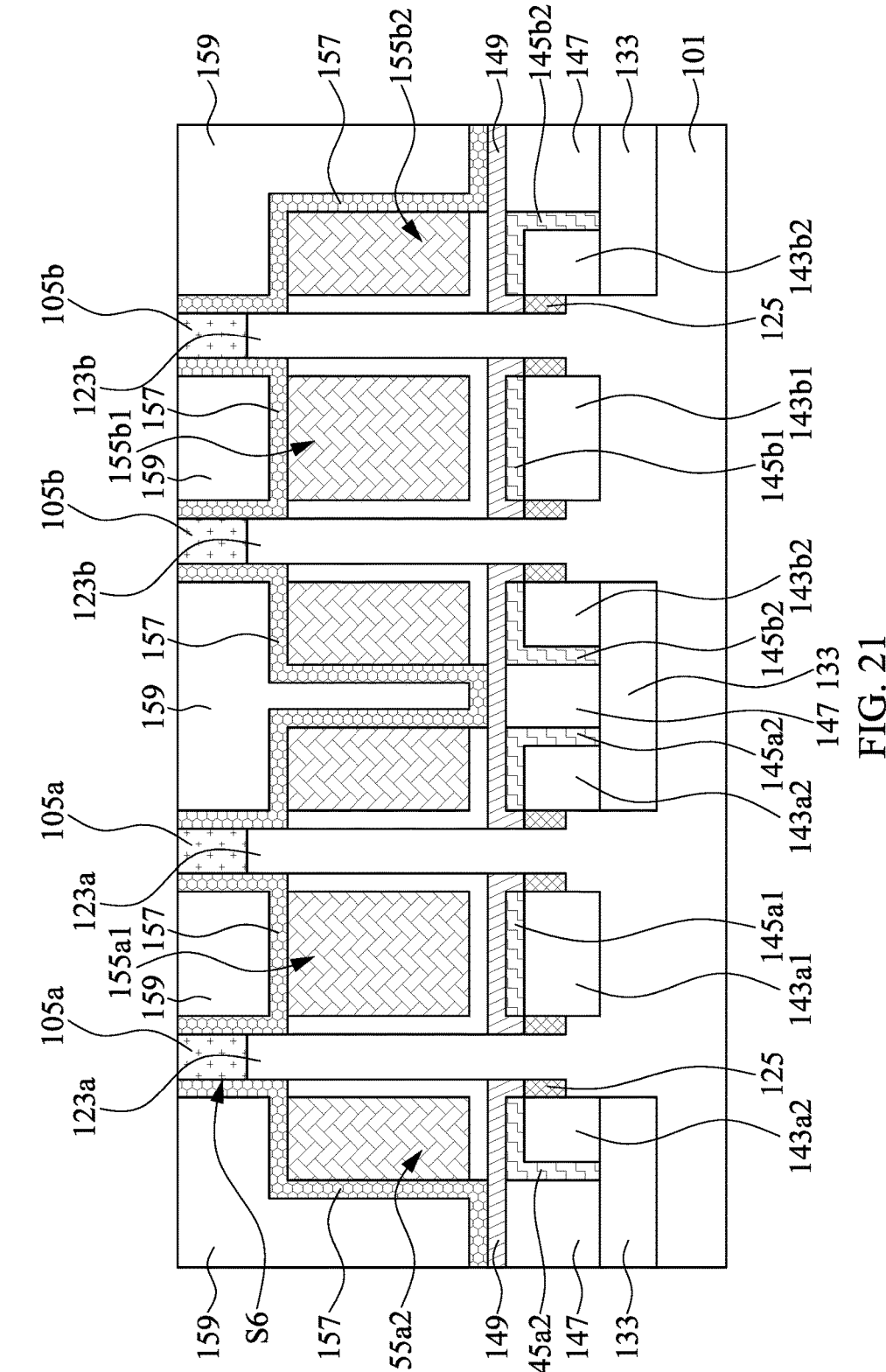
FIG. 21 is a cross-sectional view illustrating an intermediate stage of forming a top spacer layer and an ILD layer during the formation of the semiconductor device, in accordance with some embodiments.

FIG. 21 is a cross-sectional view illustrating an intermediate stage of forming a top spacer layer 157 and an ILD layer 159 over the structure of FIG. 20 during the formation of the semiconductor device 100, in accordance with some embodiments. After the first gate structures 155*a*1, 155*b*1 and the second gate structures 155*a*2, 155*b*2 are formed, they are enclosed by conformally depositing the top spacer layer 157, and the ILD layer 159 is deposited over and in direct contact with the top spacer layer 157, as shown in FIG. 21 in accordance with some embodiments. Some materials and processes used to form the top spacer layer 157 are similar to, or the same as, those used to form the bottom spacer layer 149, and details thereof are not repeated herein.

Moreover, some materials and processes used to form the ILD layer 159 are similar to, or the same as, those used to form the ILD layer 147, and details thereof are not repeated herein. However, it should be noted that, the materials of the top spacer layer 157 are different from the materials of the ILD layer 159. Afterwards, a planarization process, such as a CMP process, is performed on the ILD layer 159 until the top surfaces of the ring structures 105*a* and 105*b* are exposed. In some embodiments, portions of the top spacer layer 157 is in direct contact with portions of the bottom spacer layer 149.

Figure 22:
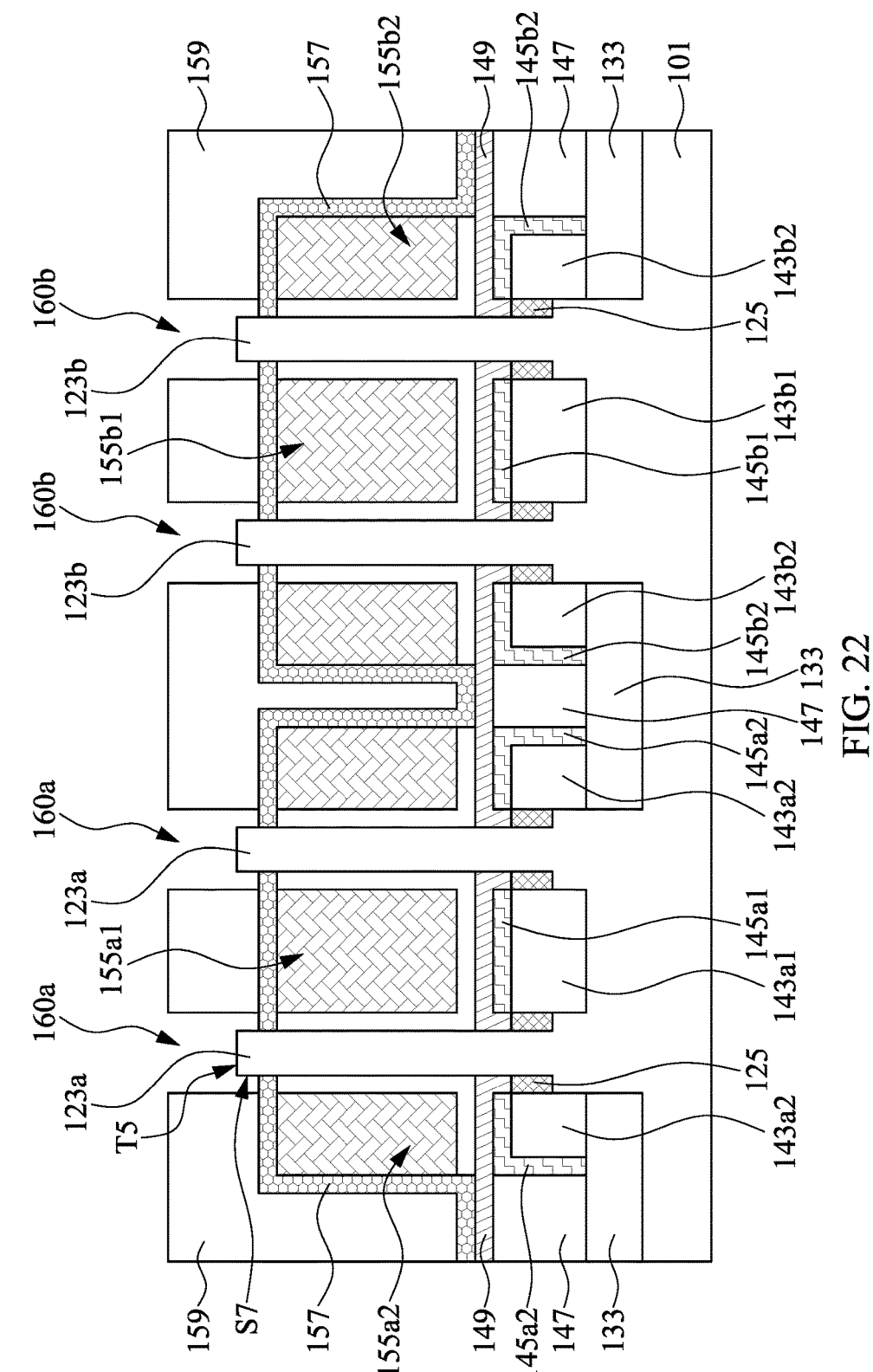
FIG. 22 is a cross-sectional view illustrating an intermediate stage of removing the ring structures and a portion of the top spacer layer during the formation of the semiconductor device, in accordance with some embodiments.

FIG. 22 is a cross-sectional view illustrating an intermediate stage of removing the ring structures 105*a*, 105*b* and portions of the top spacer layer 157 during the formation of the semiconductor device 100, in accordance with some embodiments. In some embodiments, the ring structures 105*a*, 105*b* and the vertical portions of the top spacer layer 157 that are in direct contact with sidewalls of both ring structures 105*a*, 105*b* and annular semiconductor fins 123*a*, 123*b* are removed. For example, a selective etching process, such as a wet etching process, may be used to remove the ring structures 105*a*, 105*b* and the above-mentioned portions of the top spacer layer 157.

As a result, annular openings 160*a* and 160*b* exposing the annular semiconductor fins 123*a*, 123*b* are obtained. Specifically, the top surface and a portion of the sidewalls of the annular semiconductor fin 123*a* are exposed by the annular opening 160*a*, and the top surface and a portion of the sidewalls of the annular semiconductor fin 123*b* are exposed by the annular opening 160*b*. For example, the top surface T5 and the top portion of the sidewall S7 of the annular semiconductor fin 123*a* are exposed by the annular opening

160*a*. In some embodiments, the remaining portions of the top spacer layer 157 are also exposed by the annular openings 160*a* and 160*b*.

Figure 23:
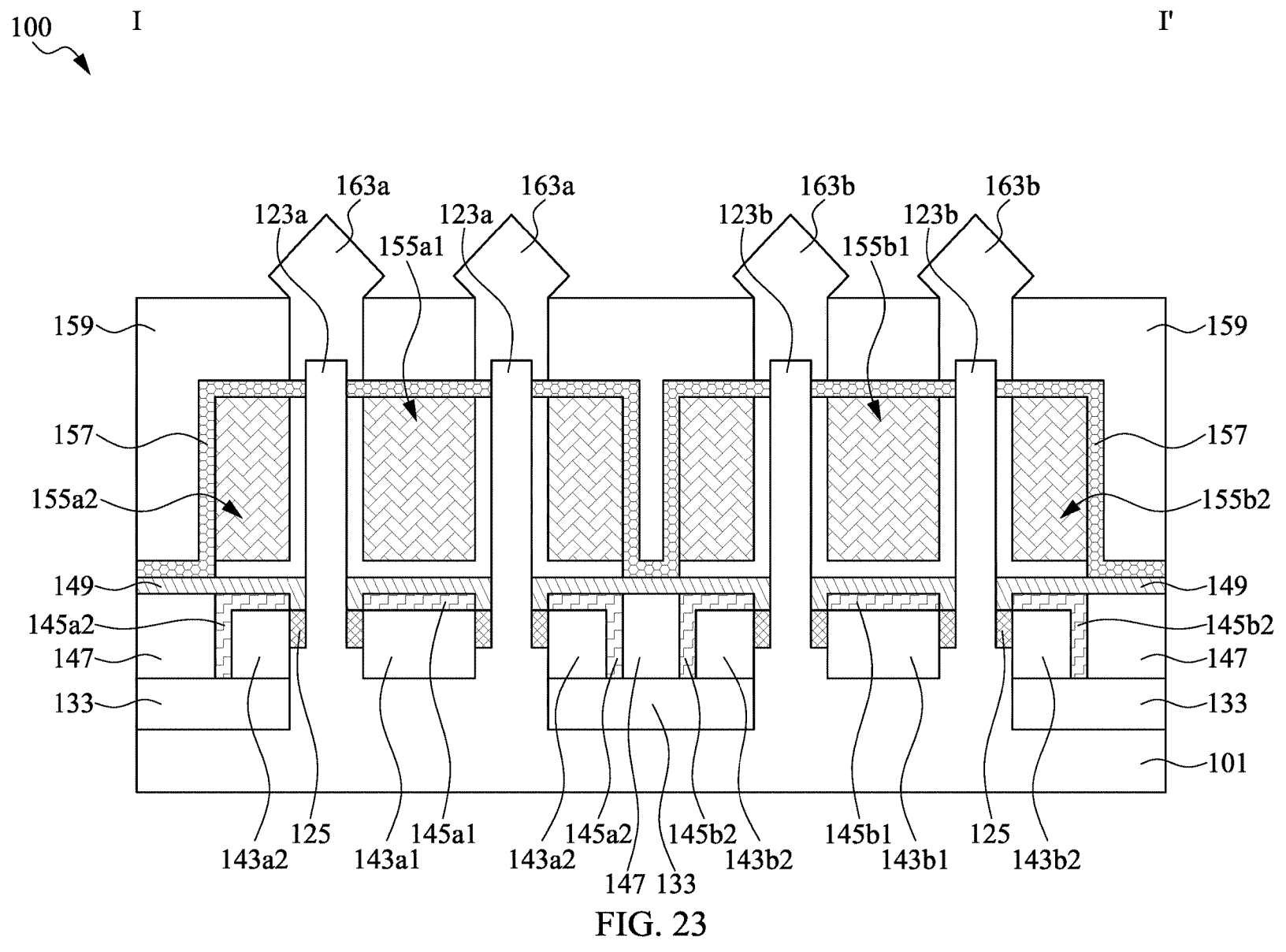

FIG. 23 is a cross-sectional view illustrating an intermediate stage of forming top source/drain structures 163*a* and 163*b* over the annular semiconductor fins 123*a* and 123*b* during the formation of the semiconductor device 100, in accordance with some embodiments. The respective step is illustrated as the step S27 in the method 10 shown in FIG. 1. In some embodiments, the top source/drain structures 163*a* and 163*b* are epitaxially grown in the annular openings 160*a* and 160*b*, respectively.

Some materials and processes used to form the top source/drain structures 163*a* and 163*b* are similar to, or the same as, those used to form the first bottom source/drain structures 143*a*1, 143*b*1 and the second bottom source/drain structures 143*a*2, 143*b*2, and details thereof are not repeated herein. In some embodiments, the top source/drain structures 163*a* and 163*b* are doped in-situ with P-type dopants, such as boron (B), or N-type dopants, such as phosphorous (P) during their epitaxial growth. In some other embodiments, the top source/drain structures 163*a* and 163*b* are not doped during their epitaxial growth. Instead, after the growth of the top source/drain structures 163*a* and 163*b*, the top source/drain structures 163*a* and 163*b* are doped in a subsequent process, such as an ion implantation process.

In particular, since the top source/drain structures 163*a* and 163*b* have slower growth rate on (111) oriented surface during their epitaxial growth, faceted top source/drain structures 163*a* and 163*b* are obtained, as shown in FIG. 23 in accordance with some embodiments. In some embodiments, the top source/drain structures 163*a* and 163*b* are in direct contact with the top surfaces and portions of the sidewalls of the annular semiconductor fins 123*a* and 123*b*. Moreover, the top source/drain structures 163*a* and 163*b* may be in direct contact with a portion of the top spacer layer 157. After the top source/drain structures 163*a* and 163*b* are grown, the semiconductor device 100 is obtained.

Embodiments of a method for preparing the semiconductor device 100 are provided in the disclosure. The method includes etching the semiconductor substrate 101 by using the ring structures 105*a* and 105*b* as a mask to form the annular semiconductor fins 123*a* and 123*b*, and forming the semiconductor device 100 (including vertical field effect transistors) by using the annular semiconductor fins 123*a* and 123*b* as vertical channels. As a result, the integration density of the semiconductor device 100 may be significantly increased.

Moreover, the method also includes forming the first gate structures 155*a*1 and 155*b*1 within the annular semiconductor fins 123*a* and 123*b* and forming the second gate structures 155*a*2 and 155*b*2 surrounding the annular semiconductor fins 123*a* and 123*b*. The first gate structures 155*a*1 and 155*b*1 may be used for current control in the vertical channels, and the second gate structures 155*a*2 and 155*b*2 may be configured to apply voltage bias to adjust the threshold voltages of the transistors. Since the first gate structures 155*a*1, 155*b*1 and the second gate structures 155*a*2, 155*b*2 may operate independently, the control of the current in the annular semiconductor fins 123*a* and 123*b* may be improved, thus upgrading the device performance.

Furthermore, by forming the second silicide layers 145*a*2 and 145*b*2 wrapping around the second bottom source/drain structures 143*a*2 and 143*b*2, the contact areas between the second silicide layers 145*a*2 and 145*b*2 and the second bottom source/drain structures 143*a*2 and 143*b*2 are increased. As a result, the contact resistances of the second bottom source/drain structures 143a2 and 143b2 may be decreased, which significantly improves the overall device performance.

Figure 29:
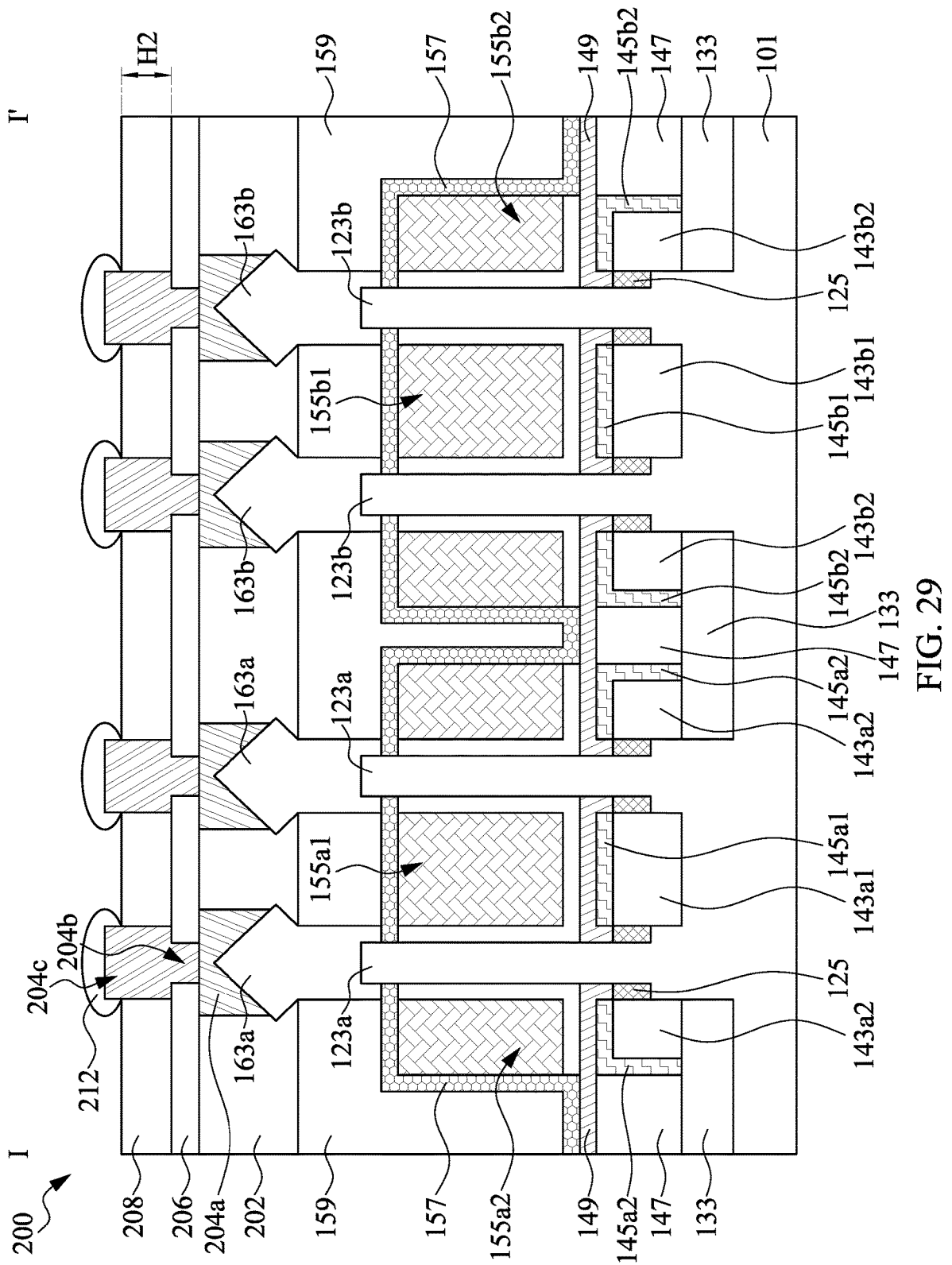
FIG. 29 is a cross-sectional view illustrating an intermediate stage of forming contact structure over the top source/drain structures during the formation of the semiconductor device, in accordance with other embodiments.

In other embodiments, the semiconductor device 100 further includes source/drain contact structures over the top source/drain structures 163a and 163b, such as a semiconductor device 200 shown in FIG. 29.

Reference is made to FIG. 24 to FIG. 29. FIG. 24 to FIG. 28 are cross-sectional views illustrating intermediate stages of forming source/drain contact structures over the top source/drain structures during the formation of the semiconductor device 200 according to other embodiments. It should be noted that the intermediate stages of forming the semiconductor device 100 shown in FIG. 2 to FIG. 23 are also applied to forming the semiconductor device 200. Therefore, the processes shown in FIG. 2 to FIG. 23 are not repeated herein.

Figure 24:
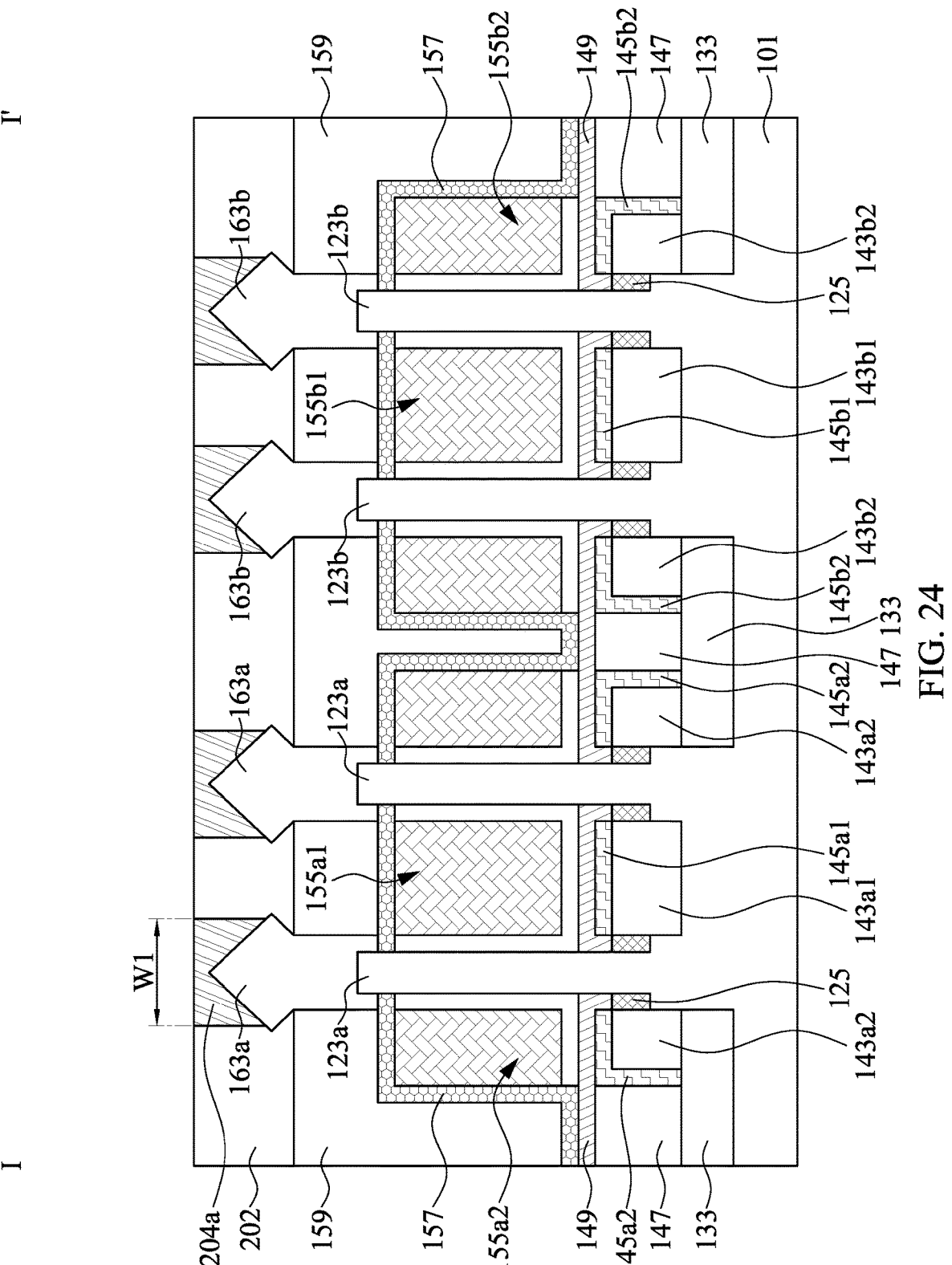
FIG. 24 is a cross-sectional view illustrating an intermediate stage of forming contact structure over the top source/drain structures during the formation of the semiconductor device, in accordance with other embodiments.

In FIG. 24, a spacer layer 202 is formed over the ILD layer 159, the top source/drain structures 163a and the top source/drain structures 163b. In some embodiments, a top surface of the spacer layer 202 is higher than a topmost point of each of the top source/drain structures 163a and 163b. After the spacer layer 202 is formed, the spacer layer 202 is etched to form openings which expose the top source/drain structures 163a and 163b. Next, a contact material is deposited into the openings. A planarization process, such as chemical mechanical polishing, may be subsequently performed to remove excess contact material, provide a substantially flat surface for subsequent processing steps, and concurrently form the lower contacts 204a as illustrated in FIG. 24.

In some embodiments, each of the lower contacts 204a has a width W1, and the width W1 is less than a width of the top source/drain structures 163a and 163b at the widest portion.

Figure 25:
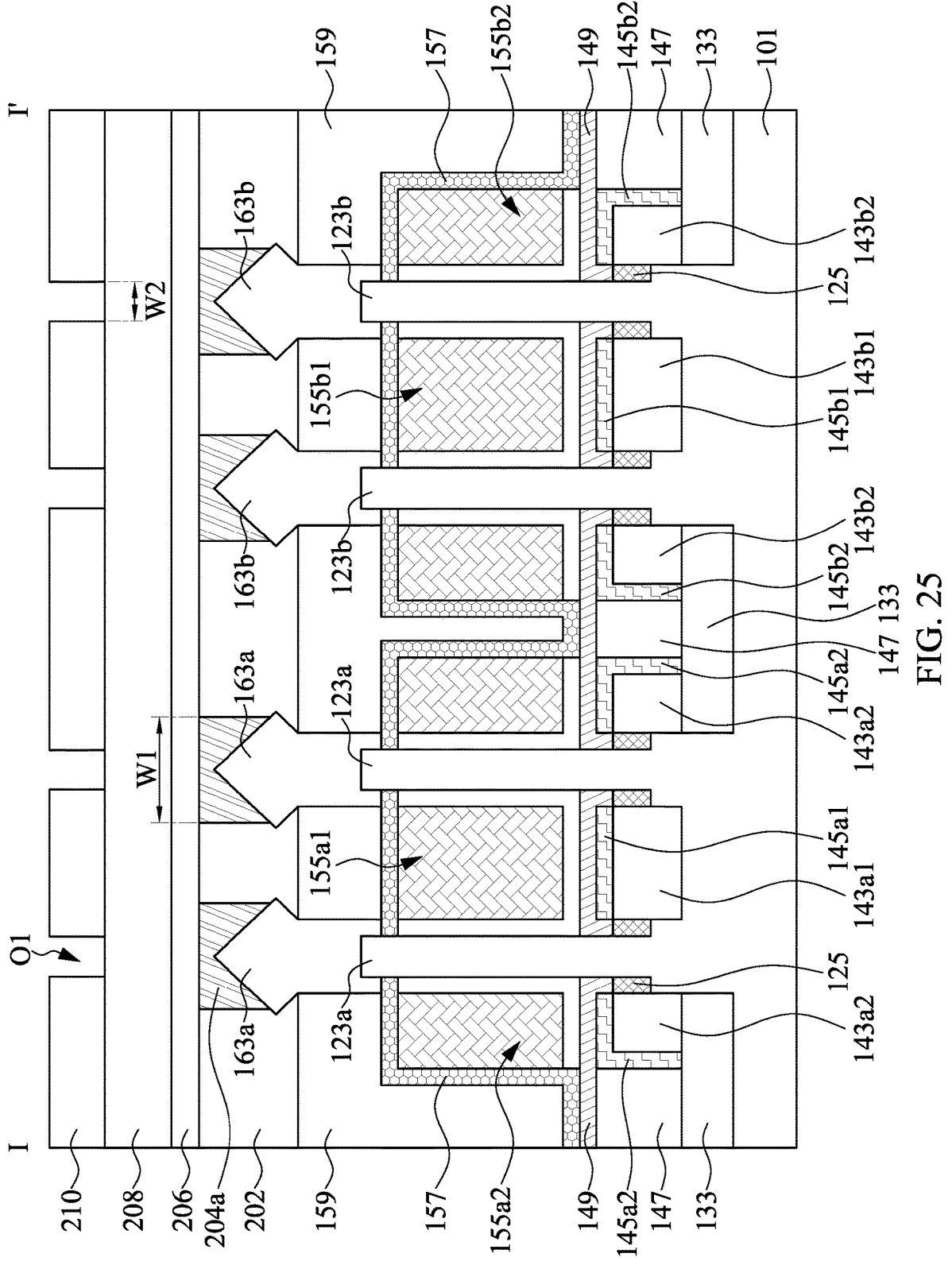
FIG. 25 is a cross-sectional view illustrating an intermediate stage of forming contact structure over the top source/drain structures during the formation of the semiconductor device, in accordance with other embodiments.

In FIG. 25, a dielectric layer 206 and a dielectric layer 208 are sequentially formed over the spacer layer 202 and the lower contacts 204a. In some embodiments, the dielectric layer 206 has a thickness between about 3 nm and about 10 nm, or about 5 nm. In some embodiments, the dielectric layer 208 has a thickness between about 10 nm and about 30 nm.

The dielectric layer 206 is formed by any suitable deposition process, such as atomic layer deposition or chemical vapor deposition. In some embodiments, the dielectric layer 206 is formed of, for example, silicon nitride, silicon boron carbon nitride, silicon carbon nitride, or silicon oxy-carbon nitride. In some embodiments, the dielectric layer 206 is formed of, for example, silicon oxide, borophosphosilicate glass, undoped silicate glass, fluorinated silicate glass, low-k dielectric materials, silicon nitride, silicon nitride oxide, silicon boron carbon nitride, silicon carbon nitride, or silicon oxy-carbon nitride.

The dielectric layer 208 is formed by any suitable deposition process, such as atomic layer deposition or chemical vapor deposition. In some embodiments, the dielectric layer 208 is formed of a material having etching selectivity to the dielectric layer 206. In some embodiments, the dielectric layer 208 is formed of an oxide such as silicon oxide.

Next, a mask layer 210 is formed over the dielectric layer 208. In some embodiments, the mask layer 210 is a photoresist layer. In some embodiments, the mask layer 210 includes a hard mask layer on the dielectric layer 208 and a photoresist layer on the hard mask layer. The mask layer 210 has a pattern of openings O1 as illustrated in FIG. 25. Each of the openings O1 is aligned with the respect lower contact 204a. In some embodiments, a width W2 of the opening O1 is less than the width W1 of the lower contact 204a.

Figure 26:
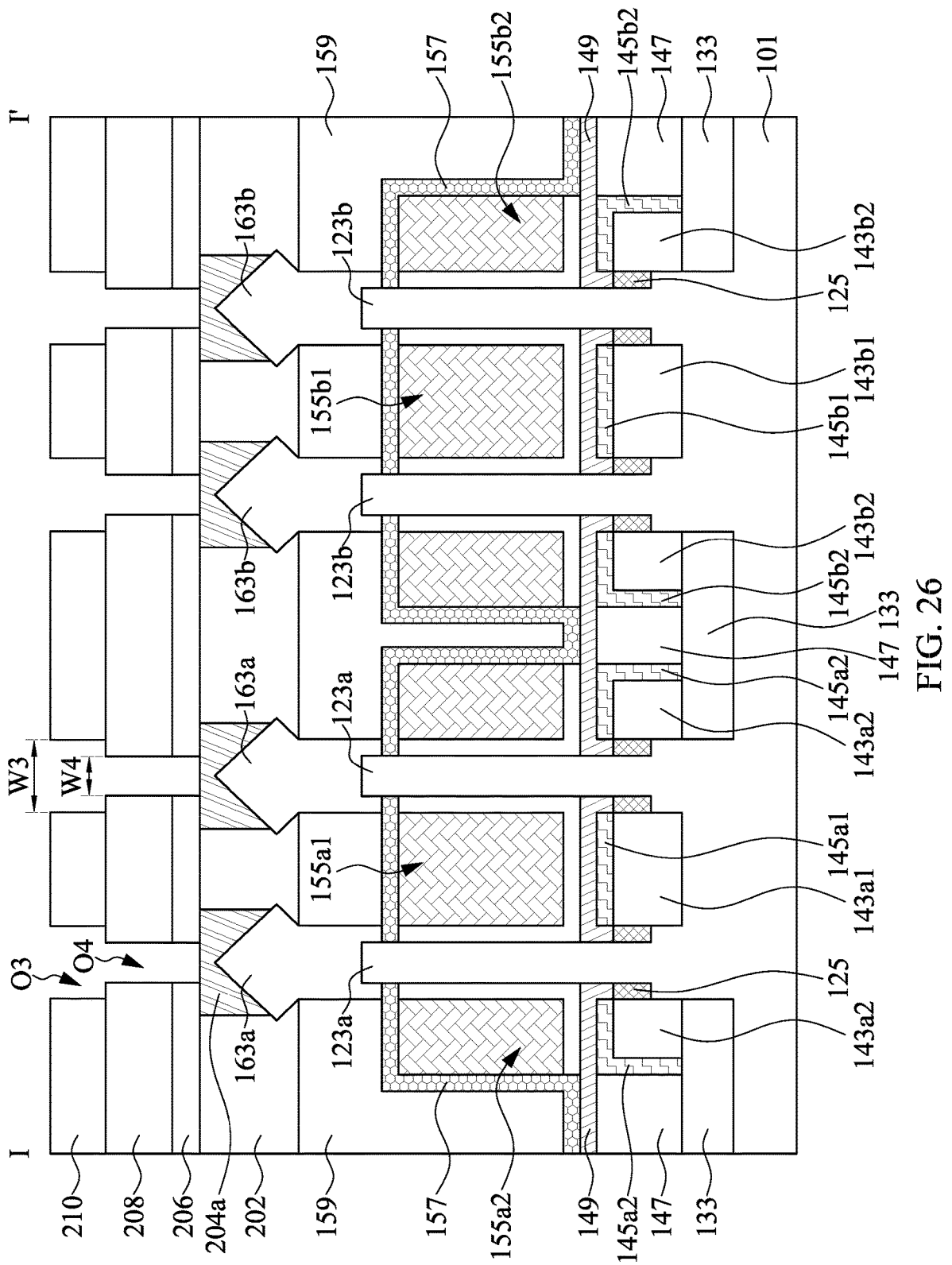
FIG. 26 is a cross-sectional view illustrating an intermediate stage of forming contact structure over the top source/drain structures during the formation of the semiconductor device, in accordance with other embodiments.

In FIG. 26, a first etch process is performed to remove portions of the dielectric layer 208 and portions of the dielectric layer 206 to form the openings O4. In current stage, the openings O4 may be disposed along the dielectric layer 206 and the dielectric layer 208. The lower contacts 204a are exposed through the openings O4. Furthermore, the openings O1 are expanded during the first etch process to be openings O3. Thus, a width W3 of the opening O3 is greater than the width W2 of the opening O1. A width W4 of the opening O4 is less than the widths W1 of the lower contact 204a. The width W4 is less than the width W3. In some embodiments, the width W3 is less than the width W1. The mask layer 210 is removed after the formation of the opening O3 and the openings O4.

Figure 27:
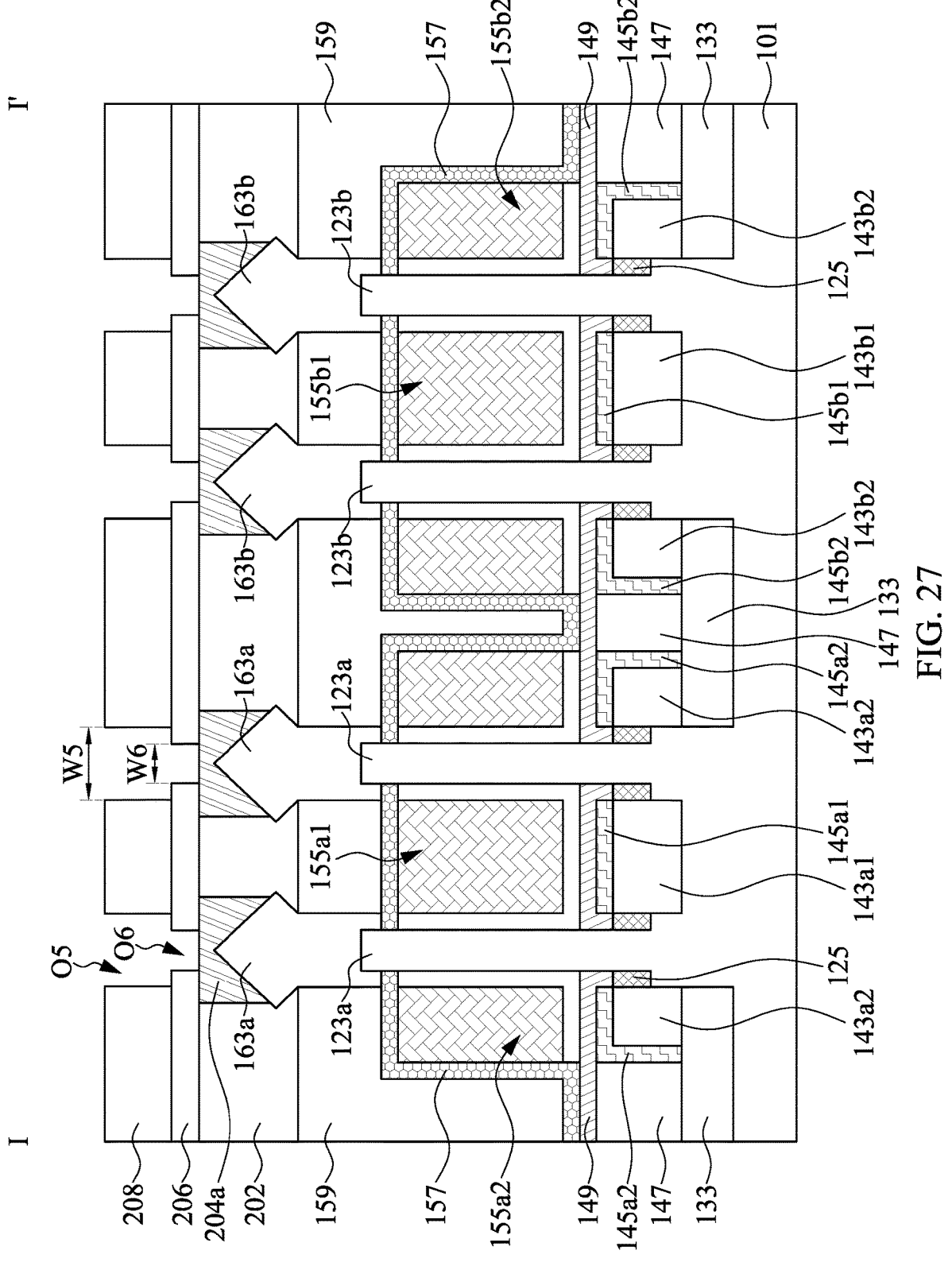
FIG. 27 is a cross-sectional view illustrating an intermediate stage of forming contact structure over the top source/drain structures during the formation of the semiconductor device, in accordance with other embodiments.

In FIG. 27, a second etch process is performed to remove portions of the dielectric layer 208 to expand the openings O4 so as to form openings O5. In some embodiments, the dielectric layer 206 is not etched by the second etch process, therefore, the remaining openings O4 at the dielectric layer 206 become openings O6. A width W5 of the openings O5 is greater than a width W6 of the openings O6. It should be noted that, since the dielectric layer 206 is not etched during the second etch process, the width W6 is equal to the width W4. In some embodiments, the width W5 of the openings O5 is greater than the width W1 of the lower contact 204a. In various embodiments, the width W5 of the openings O5 is substantially equal to the width W1 of the lower contact 204a.

Figure 28:
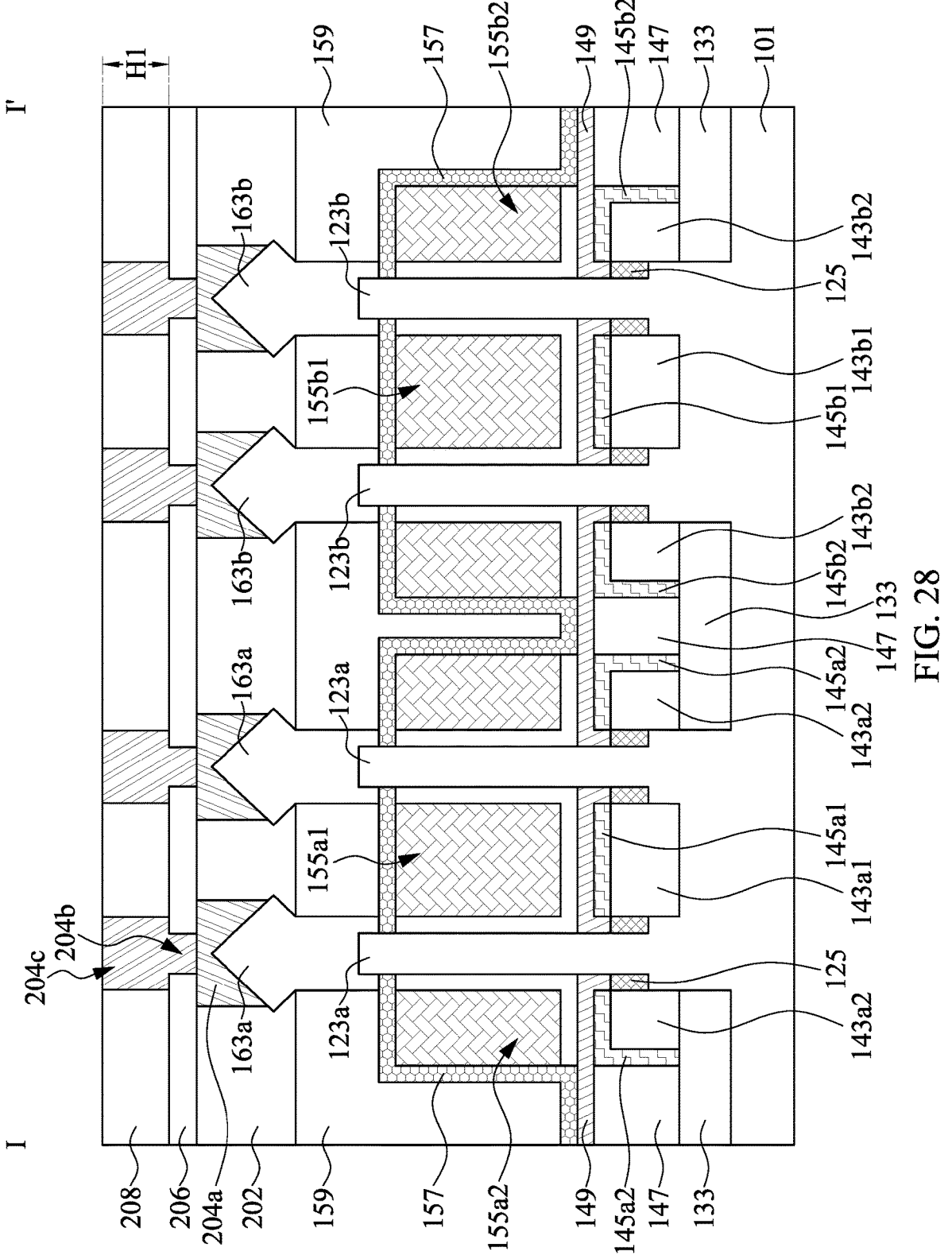
FIG. 28 is a cross-sectional view illustrating an intermediate stage of forming contact structure over the top source/drain structures during the formation of the semiconductor device, in accordance with other embodiments.

In FIG. 28, a conductive material such as tungsten, cobalt, zirconium, tantalum, titanium, aluminum, ruthenium, copper, metal carbides, metal nitrides, transition metal aluminides, or combinations thereof is deposited into the openings O5 and the openings O6 by a deposition process. After the deposition process, a planarization process, such as chemical mechanical polishing, may be performed until a top surface of the dielectric layer 208 is exposed to remove excess material, provide a substantially flat surface for subsequent processing steps, and concurrently form middle contacts 204b in the openings O6 and upper contacts 204c in the openings O5.

In FIG. 29, a third etch process is performed to recess the dielectric layer 208. The dielectric layer 208 originally having a thickness H1 (shown in FIG. 28) is thinner after the third etch process, and has a thickness H2 which is less than the thickness H1.

In some embodiments, the upper contacts 204c are not etched by the third etch process, therefore, the upper contacts 204c protrude from the dielectric layer 208 after the third etch process. After the third etch process is performed, conductive covering layers 212 are formed over the upper contacts 204c and the dielectric layer 208. In some embodiments, the conductive covering layer 212 is formed of, for example, copper germanide. In some embodiments, the conductive covering layer 212 is formed by, for example, sputtering, electron beam thermal evaporation, vapor-solid reaction, or epitaxial growth. In the present embodiments, the conductive covering layer 212 formed of epitaxial growth is preferred to provide lower electrical resistivity.

More specifically, the conductive covering layer 212 has a rounded contour. The conductive covering layer 212 is in direct contact with and covering the entire protruding portion of the upper contact 204c. As shown in FIG. 29, the protruding portion of the upper contact 204c is enclosed by the conductive covering layer 212. The conductive covering layer 212 is further in contact with the dielectric layer 208.

Figure 30:
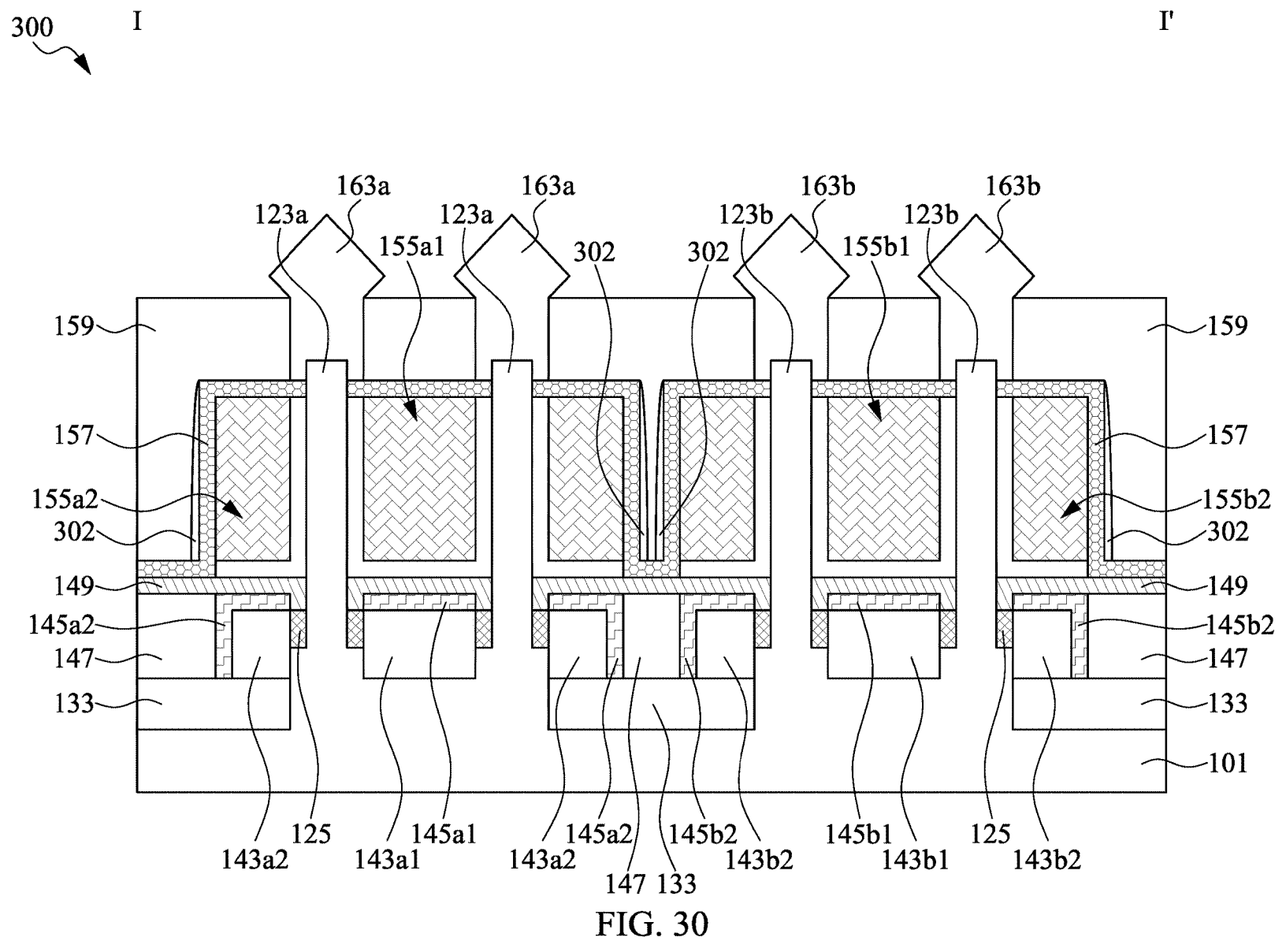

In various embodiments, the semiconductor device 100 further includes liners disposed between the gate structures, such as a semiconductor device 300 shown in FIG. 30. In some embodiments, the liners are configured to enhance the isolation between the gate structures.

Reference is made to FIG. 30. FIG. 30 is a cross-sectional view illustrating an intermediate stage of forming liners during the formation of the semiconductor device 300, in accordance with various embodiments. It should be noted that the intermediate stages of forming the semiconductor device 100 shown in FIG. 2 to FIG. 23 are also applied to forming the semiconductor device 300. Therefore, the processes shown in FIG. 2 to FIG. 23 are not repeated herein.

In various embodiments, before the ILD layer 159 is formed, a liner layer is comformally deposited on the top spacer layer 157. More specifically, the portion of the top spacer layer 157 between the annular semiconductor fins 123*a* and 123*b* is covered by the liner layer. Therefore, there is a portion of liner layer is deposited between the annular semiconductor fins 123*a* and 123*b*.

In some embodiments, the liner layer is formed of, for example, titanium, titanium nitride, titanium-tungsten alloy, tantalum, tantalum nitride, or a combination thereof.

After the liner layer is deposited, an etch process, such as an anisotropic dry etch process, is performed to form liners 302. In other words, the liners 302 are the remaining portions of the liner layer after the etch process.

As illustrated in FIG. 30, the top spacer layer 157 forms a trench between the annular semiconductor fins 123*a* and 123*b*, and also forms trenches besides the annular semiconductor fins 123*a* and 123*b*. The liners 302 cover the side surface of the top spacer layer 157 in the trenches mentioned above. Each of the liners 302 has a vertical side, a curved side, and a bottom side. The vertical side and the bottom side are attached to the top spacer layer 157, and the curved side connects the vertical side to the bottom side. Each of the liners 302 has a widest width along the bottom side, and the width is shrunk from the bottom side to a cross point of the vertical side and the curved side. The cross point of the vertical side and the curved side coincides with a corner of the trench.

After the liners 302 are formed, the ILD layer 159 is formed, and the following processes of the semiconductor device 300 are substantially the same as those processes shown in FIG. 22 to FIG. 23.

In alternative embodiments, the semiconductor device 200 further includes the liners 302.

In one embodiment of the present disclosure, a semiconductor device includes an annular semiconductor fin over a semiconductor substrate, a first bottom source/drain structure within the annular semiconductor fin, a second bottom source/drain structure surrounding the annular semiconductor fin, a first silicide layer, a second silicide layer, a first gate structure, a second gate structure, a top source/drain structure, and a contact structure over the top source/drain structure. The first silicide layer and the second silicide layer are over the first bottom source/drain structure and the second bottom source/drain structure, respectively. The first gate structure and the second gate structure are over the first silicide layer and the second silicide layer, respectively. The contact structure includes a lower contact, a middle contact over the lower contact, and an upper contact over the middle contact. A width of the upper contact is greater than a width of the middle contact.

In another embodiment of the present disclosure, a method for preparing a semiconductor device is provided. The method includes: forming a ring structure over a semiconductor substrate; etching the semiconductor substrate by using the ring structure as a mask to form an annular semiconductor fin; epitaxially growing a first bottom source/drain structure within the annular semiconductor fin and a second bottom source/drain structure surrounding the annular semiconductor fin; forming a first silicide layer over the first bottom source/drain structure and a second silicide layer over the second bottom source/drain structure; forming a first gate structure over the first silicide layer and a second gate structure over the second silicide layer; epitaxially growing a top source/drain structure over the annular semiconductor fin; and forming a contact structure over the top source/drain structure. The step of forming the contact structure over the top source/drain structure includes: forming a lower contact of the contact structure over the top source/drain structure; forming a middle contact of the contact structure over the lower contact; and forming an upper contact over the middle contact. A width of the upper contact is greater than a width of the middle contact.

The embodiments of the present disclosure have some advantageous features. By using a ring structure to form an annular semiconductor fin from a semiconductor substrate, and forming a transistor by using the annular semiconductor fin as a vertical channel, the integration density of the semiconductor device may be significantly increased. In addition, a gate structure formed within the annular semiconductor fin and a gate structure formed surrounding the annular semiconductor fin can operate independently, and silicide layers are formed wrapping around the bottom source/drain structures. Therefore, the overall device performance may be significantly improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device, comprising:

forming a ring structure over a semiconductor substrate;

etching the semiconductor substrate by using the ring structure as a mask to form an annular semiconductor fin;

epitaxially growing a first bottom source/drain structure within the annular semiconductor fin and a second bottom source/drain structure surrounding the annular semiconductor fin;

forming a first silicide layer over the first bottom source/drain structure and a second silicide layer over the second bottom source/drain structure;

forming a first gate structure over the first silicide layer and a second gate structure over the second silicide layer;

epitaxially growing a top source/drain structure over the annular semiconductor fin; and forming a contact structure over the top source/drain structure, comprising:

forming a lower contact of the contact structure over the top source/drain structure;

forming a middle contact of the contact structure over the lower contact; and forming an upper contact over the middle contact, wherein a width of the upper contact is greater than a width of the middle contact.

2. The method of claim 1, wherein a width of the lower contact is greater than the width of the middle contact.

3. The method of claim 1, further comprising:

forming a first ion implanted area and a second ion implanted area, wherein the first ion implanted area is disposed between the first bottom source/drain structure and the annular semiconductor fin, and the second ion implanted area is disposed between the second bottom source/drain structure and the annular semiconductor fin.

4. The method of claim 3, further comprising:

forming a bottom spacer layer covering the first silicide layer and the second silicide layer and in contact with the annular semiconductor fin, wherein the bottom spacer layer has a first protruding portion and a second protruding portion, wherein the first protruding portion disposed within the annular semiconductor fin and between the first silicide layer and the annular semiconductor fin, and the second protruding portion is surrounding the annular semiconductor fin and disposed between the second silicide layer and the annular semiconductor fin, wherein the first protruding portion is disposed over the first ion implanted area, and the second protruding portion is disposed over the second ion implanted area.

5. The method of claim 4, further comprising:

forming a top spacer layer over the bottom spacer layer, the first gate structure, and the second gate structure, wherein the top spacer layer comprises a first portion and a second portion, wherein the first portion of the top spacer layer is over the first gate structure and within the annular semiconductor fin, and the second portion of the top spacer layer is over the second gate structure, wherein the second portion of the top spacer layer comprises a first segment in contact with the top spacer layer, a second segment in contact with a sidewall of a second gate electrode of the second gate structure, and a third segment in contact with a top surface of the second gate electrode, wherein the annular semiconductor fin is protruding from the top spacer layer, and the top source/drain structure is in contact with the top spacer layer.

6. The method of claim 5, further comprising:

forming a liner in contact with the first segment and the second segment of the second portion of the top spacer layer, wherein the liner has a vertical side, a bottom side, and a curved side, wherein the vertical side is attached to the second segment of the second portion of the top spacer layer, the bottom side is attached to the first segment of the second portion of the top spacer layer, and the curved side connects the vertical side to the bottom side, wherein a width of the liner is shrunk from the bottom side to a cross point of the vertical side and the curved side.

7. The method of claim 5, further comprising:

forming a first interlayer dielectric (ILD) layer surrounding the second silicide layer; and forming a second ILD layer disposed over the top spacer layer, wherein the second ILD layer is in contact with the top source/drain structure, wherein the first ILD layer and the second ILD layer are separated by the bottom spacer layer and the top spacer layer.

8. The method of claim 7, further comprising:

forming a spacer layer over the second ILD layer; and forming a first opening in the spacer layer, wherein the top source/drain structure is exposed by the first opening, wherein the lower contact of the contact structure is formed in the first opening.

9. The method of claim 8, further comprising:

after forming the lower contact of the contact structure, forming a first dielectric layer disposed over the spacer layer;

forming a second dielectric layer over the first dielectric layer;

forming a second opening in the first dielectric layer and a third opening in the second dielectric layer, wherein the lower contact is exposed by the second opening, and the second opening is aligned with the third opening; and expanding the third opening in the second dielectric layer to be a fourth opening.

10. The method of claim 8, wherein the middle contact is formed in the second opening, and the upper contact is formed in the fourth opening.

11. The method of claim 10, further comprising:

after the upper contact is formed, thinning the second dielectric layer to make the upper contact protruding from the second dielectric layer; and forming a conductive covering layer over the upper contact.

12. The method of claim 8, wherein a width of the second opening is less than a width of the fourth opening.

* * * * *